(12) United States Patent
Matsuda

(10) Patent No.: US 8,384,451 B2
(45) Date of Patent: Feb. 26, 2013

(54) PLL CIRCUIT, METHOD FOR OPERATING PLL CIRCUIT AND SYSTEM

(75) Inventor: Atsushi Matsuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 27 days.

(21) Appl. No.: 13/190,705

(22) Filed: Jul. 26, 2011

(65) Prior Publication Data

US 2012/0025879 A1 Feb. 2, 2012

(30) Foreign Application Priority Data

Jul. 28, 2010 (JP) ................. 2010-169554

(51) Int. Cl.
*H03L 7/08* (2006.01)
(52) U.S. Cl. ........................ 327/156; 327/292
(58) Field of Classification Search .................. 327/156, 327/158, 159, 291, 292, 298, 299
See application file for complete search history.

(56) References Cited

U.S. PATENT DOCUMENTS

| 5,018,170 | A | * | 5/1991 | Wilson | 375/376 |
| 5,841,303 | A | * | 11/1998 | Takashi et al. | 327/156 |
| 6,429,693 | B1 | | 8/2002 | Staszewski et al. | |
| 7,859,344 | B2 | | 12/2010 | Uozumi et al. | |
| 7,994,867 | B2 | * | 8/2011 | Kobayashi | 331/1 A |
| 8,237,511 | B2 | * | 8/2012 | Kobayashi | 331/1 A |
| 2010/0182060 | A1 | * | 7/2010 | Fujino et al. | 327/159 |
| 2011/0156776 | A1 | * | 6/2011 | Kizer | 327/156 |
| 2011/0234270 | A1 | * | 9/2011 | Kobayashi | 327/156 |
| 2012/0092052 | A1 | * | 4/2012 | Matsuda | 327/158 |

FOREIGN PATENT DOCUMENTS

| JP | 2002-76886 A | 3/2002 |
| JP | 2009-268047 | 11/2009 |

* cited by examiner

*Primary Examiner* — Lincoln Donovan
*Assistant Examiner* — Jung H Kim
(74) *Attorney, Agent, or Firm* — Fujitsu Patent Center

(57) ABSTRACT

A PLL circuit includes: a first counter to accumulate a frequency command word in response to a reference clock signal and to generate a first counted value; a second counter to count an output clock signal and generate a second counted value; a time measuring circuit to measure an interval between a transition edge of the reference clock signal and a transition edge of the output clock signal to output a third counted value; a phase difference normalizing circuit to multiply the third counted value by a normalizing coefficient to generate a first phase difference; an operating circuit to subtract a value obtained by subtracting the first phase difference from the second counted value from the first counted value to generate a phase difference signal; and an oscillator to change a frequency of the output clock signal based on the phase difference signal.

17 Claims, 20 Drawing Sheets

PLL CIRCUIT, METHOD FOR OPERATING PLL CIRCUIT AND SYSTEM

CROSS-REFERENCE TO RELATED APPLICATIONS

This application claims the benefit of priority from Japanese Patent Application No. 2010-169554 filed on Jul. 28, 2010, the entire contents of which are incorporated herein by reference.

BACKGROUND

1. Field

The embodiments discussed herein relate to a PLL circuit and a method for operating a PLL circuit.

2. Description of Related Art

Analog circuits are being replaced with digital circuits due to an increase in electric currents, an increase in circuit areas or variances in characteristics, for example. As an operation voltage of a semiconductor circuit reduces, a dynamic range of an Analog to Digital Converter (ADC) may be reduced. An All Digital Phase-Locked Loop (ADPLL) circuit which uses a Time to Digital Converter (TDC) for discretizing time may be provided.

Related art is disclosed in Japanese Unexamined Patent Application Publication No. 2002-76886 or 2009-268047, etc.

SUMMARY

According to one aspect of the embodiments, A PLL circuit includes: a first counter to accumulate a frequency command word in response to a reference clock signal and to generate a first counted value; a second counter to count a clock pulse of an output clock signal and generate a second counted value; a time measuring circuit to measure an interval between a transition edge of the reference clock signal and a transition edge of the output clock signal to output the interval as a third counted value; a phase difference normalizing circuit to multiply the third counted value by a normalizing coefficient to normalize the third counted value into a first phase difference corresponding to the number of clock pulses of the output clock signal; an operating circuit to obtain a subtraction value by subtracting the first phase difference from the second counted value and to subtract the subtraction value from the first counted value to generate a phase difference signal indicating a second phase difference between the reference clock signal and the output clock signal; and an oscillator circuit to change a frequency of the output clock signal based on the phase difference signal, wherein the phase difference normalizing circuit changes the normalizing coefficient until the second phase difference at a first value and the second phase difference at a second value appear at random when the second phase difference at the first value or the second phase difference at the second value consecutively appears after the PLL is locked.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
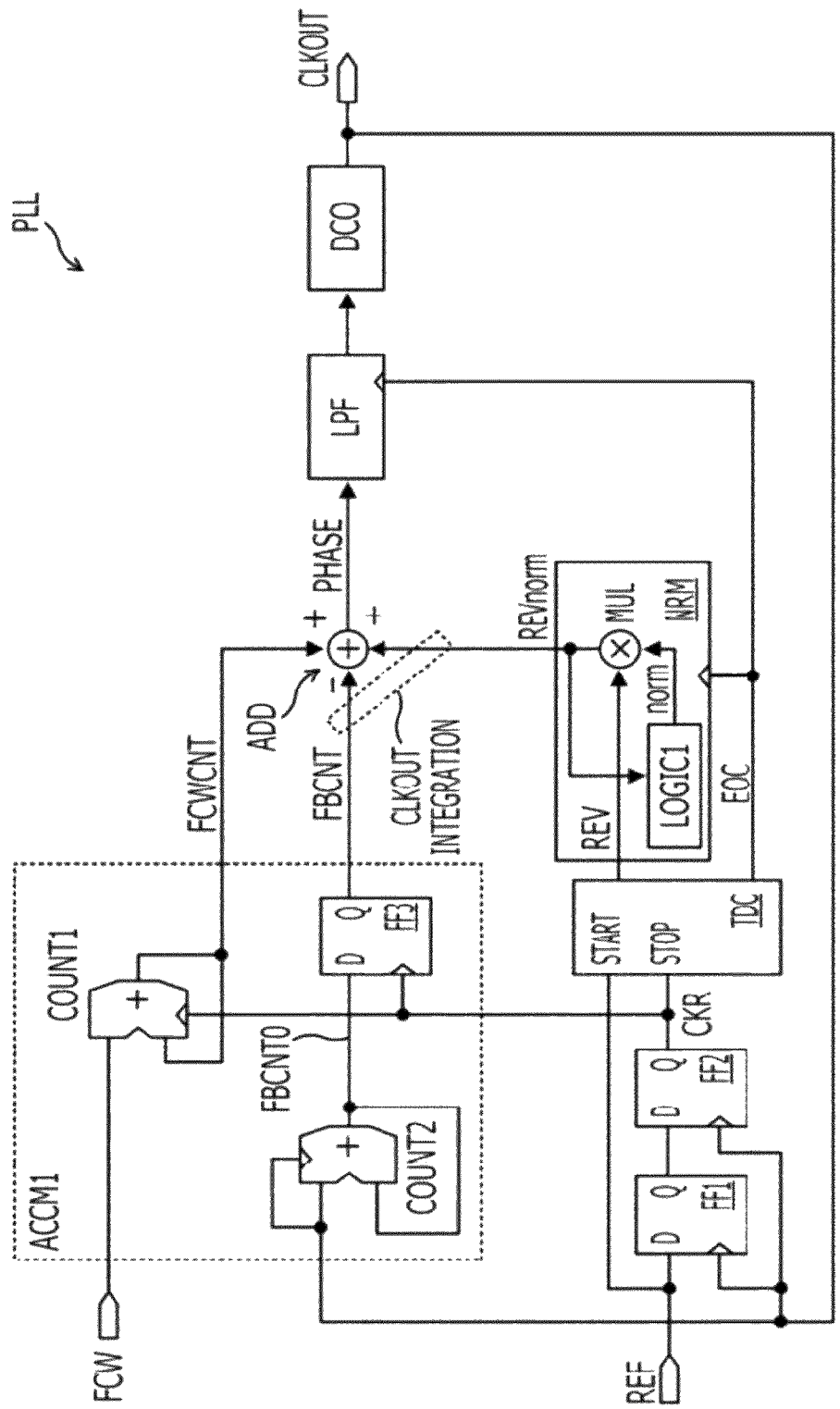
FIG. 1 illustrates an exemplary PLL circuit.

FIG. 1 illustrates an exemplary phase-locked loop (PLL) circuit. The PLL circuit illustrated in FIG. 1 may have an integer multiplying function. The PLL circuit may include, e.g., an all digital phase-locked loop (ADPLL) circuit. The PLL circuit includes flip-flop circuits FF1 and FF2, a Time to Digital Converter (TDC) circuit, a phase difference normalizing circuit NRM, an accumulator ACCM1, an adder ADD, a loop filter LPF and a Digitally Controlled Oscillator (DCO) circuit.

The flip-flop circuits FF1 and FF2 may be coupled in series. The flip-flop circuit FF1 receives a reference clock signal REF and an output clock signal CLKOUT of the PLL circuit at an input terminal D and at a clock terminal, respectively. The flip-flop circuit FF2 receives an output signal Q of the flip-flop circuit FF1 and the output clock signal CLKOUT at an input terminal D and at a clock terminal, respectively, and outputs a clock signal CKR from an output terminal Q. The clock signal CKR may rise in synchronization with a second leading edge of the output clock signal CLKOUT following a leading edge of the reference clock signal REF. The clock signal CKR may fall in synchronization with a second leading edge of the output clock signal CLKOUT following a trailing edge of the reference clock signal REF. The flip-flop circuits FF1 and FF2 coupled in series may reduce a metastable state of the clock signal CKR.

The TDC circuit measures an interval in, e.g., an analog value between a leading edge of the reference clock signal REF received at a start terminal START and a leading edge of the clock signal CKR received at a stop terminal STOP, and outputs a measured value as a counted value REV in, e.g., a digital value. The TDC circuit measures an interval after a transition edge, e.g., a leading edge of the reference clock signal REF and before a transition edge indicating a clock cycle of the output clock signal CLKOUT, e.g., a leading edge appears twice, e.g., a phase difference, and outputs the measured interval as the counted value REV. The TDC circuit outputs an end signal EOC together with the counted value REV.

The phase difference normalizing circuit NRM includes a logic circuit LOGIC1 and a multiplier MUL. The logic circuit LOGIC1 receives a normalized phase difference REVnorm output by the multiplier MUL, and generates a normalizing coefficient norm. As the normalized phase difference REVnorm is repeatedly fed back to the logic circuit LOGIC1, the normalizing coefficient norm is adjusted. The multiplier MUL multiplies the counted value REV by the normalizing coefficient norm so as to generate the phase difference REVnorm. The phase difference normalizing circuit NRM multiplies the counted value REV by the normalizing coefficient norm, and normalizes the interval measured by the TDC circuit into the phase difference REVnorm indicated by the number of the clock pulses of the output clock signal CLKOUT.

The accumulator ACCM1 includes counters COUNT1 and COUNT2, and a flip-flop circuit FF3. The counter COUNT1 accumulates a frequency command word FCW in synchronization with the clock signal CKR generated in response to the reference clock signal REF, and outputs the accumulated frequency command word as a counted value FCWCNT. The counted value FCWCNT may indicate a phase of the clock signal CKR. The frequency command word FCW may be a positive integer. The PLL circuit may include an integer multiplying circuit. When the counter COUNT1 is a 6-bit counter and the frequency command word FCW is "8", e.g., counted values FCWCNT indicating decimal numbers "0", "8", "16", "24", "32", "40", "48" and "56" may be cyclically generated in synchronization with the clock signal CKR.

The counter COUNT2 accumulates the number of the clock pulses of the output clock signal CLKOUT, and outputs the accumulated number of CLKOUT as a counted value FBCNT0. The counted value FBCNT0 may increase by "1" in synchronization with the output clock signal CLKOUT. When the counter COUNT2 is the same 6-bit counter as the counter COUNT1, e.g., counted values FBCNT0 "0"-"63" in decimal numbers may be cyclically generated in synchronization with the output clock signal CLKOUT. The flip-flop circuit FF3 receives the counted value FBCNT0 in synchronization with the clock signal CKR, and outputs the received FBCNT0 as a counted value FBCNT. The counted value FBCNT may indicate a phase of the output clock signal CLKOUT synchronized with the clock signal CKR.

The adder ADD calculates a difference between the counted value FCWCNT and a CLKOUT integration, and outputs the calculated difference as a phase difference signal PHASE. The phase difference signal PHASE may be indicated in accordance with Equation (1).

$$PHASE = FCWCNT - CLKOUT\ integration \quad (1)$$

The CLKOUT integration may correspond to a difference between the counted value FBCNT and the normalized phase difference REVnorm, and may be indicated in accordance with Equation (2).

$$CLKOUT\ integration = FBCNT - REVnorm \quad (2)$$

The phase difference signal PHASE may be indicated from Equations (1) and (2) by Equation (3).

$$PHASE = FCWCNT - FBCNT + REVnorm \quad (3)$$

The loop filter LPF removes high frequency components and noise included in the phase difference signal PHASE. The DCO circuit generates the output clock signal CLKOUT based on an output from the loop filter LPF. The DCO circuit changes a frequency of the output clock signal CLKOUT based on the phase difference signal PHASE supplied through the loop filter LPF so that the reference clock signal REF and the output clock signal CLKOUT are in phase. The DCO circuit may include, e.g., an oscillator circuit.

Figure 2:
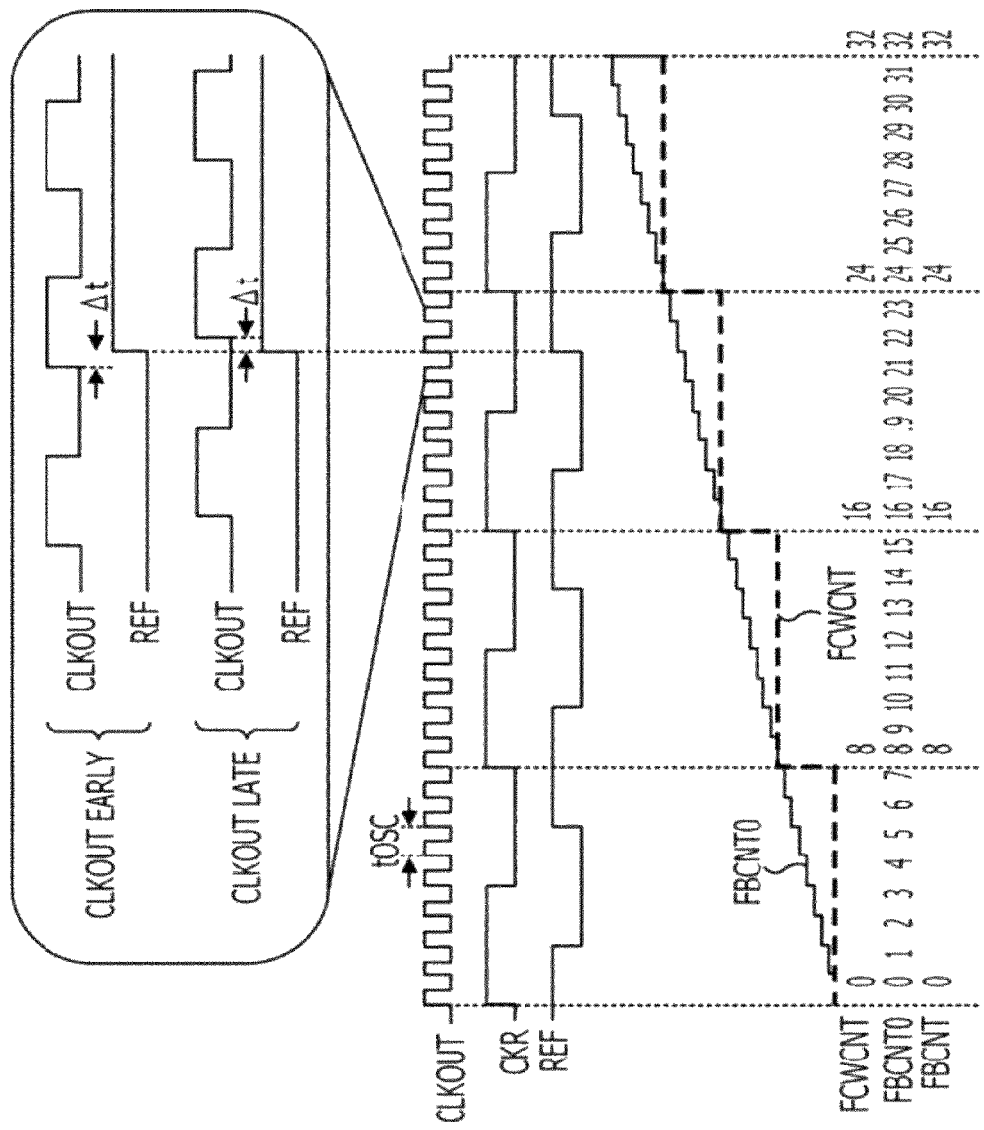
FIG. 2 illustrates an exemplary operation of an accumulator.

FIG. 2 illustrates an exemplary operation of an accumulator. The accumulator illustrated in FIG. 1 may operate as illustrated in FIG. 2. The counters COUNT1 and COUNT2 may be 16-bit counters, and the frequency command word FCW may be set to "8", for example.

The counter COUNT1 illustrated in FIG. 1 updates the counted value FCWCNT to "0", "8", "16", "24", . . . in synchronization with the clock signal CKR. The counter COUNT2 may increase the counted value FBCNT0 by "1" in synchronization with the output clock signal CLKOUT. As the counted value FBCNT0 increases in synchronization with the output clock signal CLKOUT, the counted value FBCNT0 may indicate the number of the clock pulses of the output clock signal CLKOUT. The flip-flop circuit FF3 outputs the counted value FBCNT0 as the counted value FBCNT in synchronization with the clock signal CKR. The counted values FCWCNT and FBCNT may differ from each other.

Figure 3:
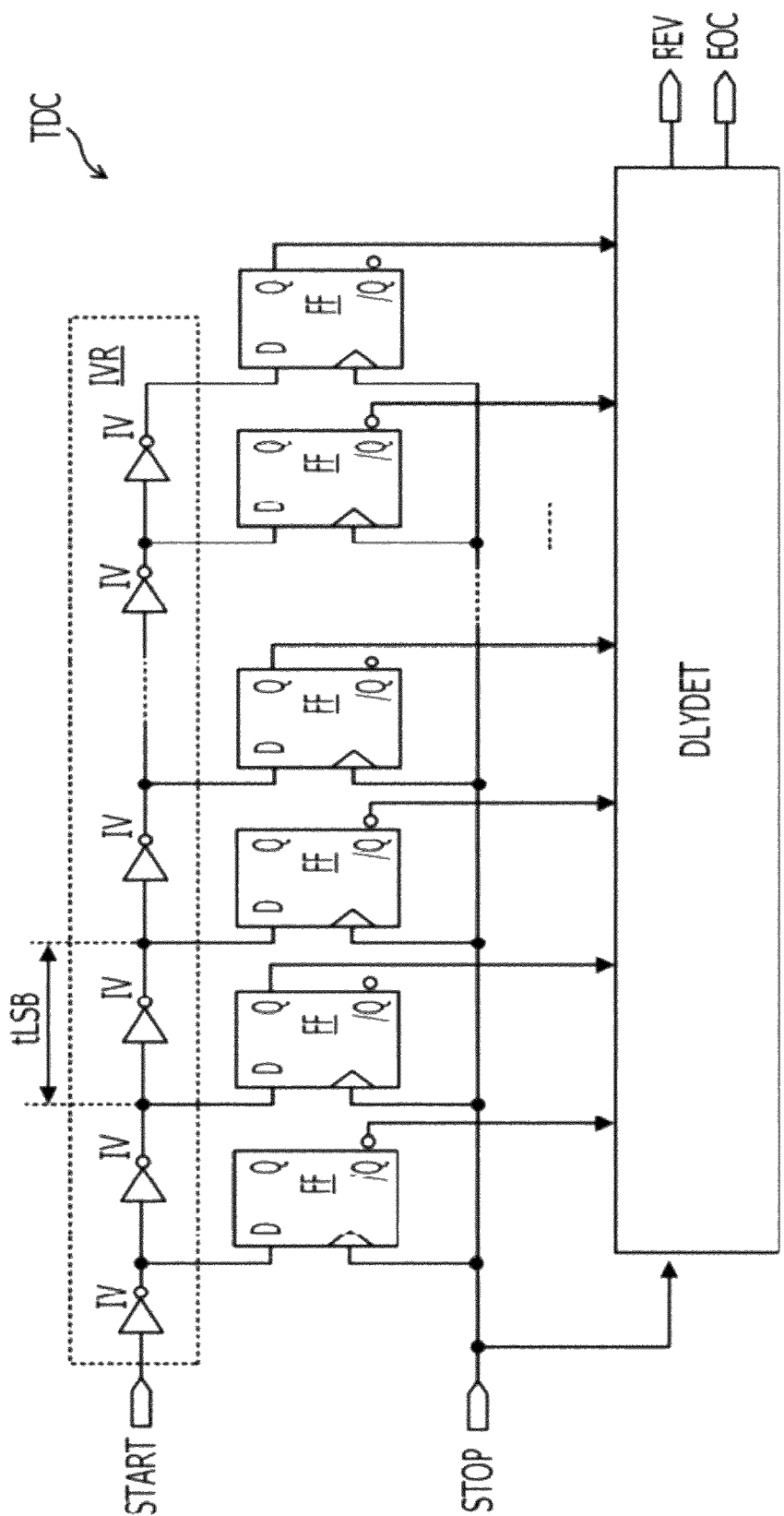
FIG. 3 illustrates an exemplary TDC circuit.

FIG. 3 illustrates an exemplary TDC circuit. The TDC circuit illustrated in FIG. 3 may correspond to the TDC circuit illustrated in FIG. 1. The TDC circuit detects an interval between a starting signal START and a stopping signal STOP, e.g., approximately two cycles of the output clock signal CLKOUT as a digital value, and may be a circuit other than the circuit illustrated in FIG. 3.

The TDC circuit includes a series of inverters IVR including a plurality of inverters IV coupled in series, a plurality of flip-flop circuits FF each coupled to outputs of the individual inverters IV, and a delay detecting circuit DLYDET. Time delays tSLB of the respective inverters IV may substantially equal one another. The TDC circuit may have a resolution capability for detecting an interval which is substantially the same as the time delay tSLB, for example. A first stage inverter IV of the series of inverters IVR receives a leading edge of the starting signal START, and following inverters IV successively delay the leading edge of the starting signal START, and a delayed signal is output from the output terminal Q. The time delay of all the inverters IV included in the series of inverters IVR may be longer than the interval between the starting signal START and the stopping signal STOP.

Each of the flip-flop circuits FF latches a logical level of a delayed signal from the respective inverter IV in synchronization with a leading edge of the stopping signal STOP. The delay detecting circuit DLYDET receives an output level of each of the flip-flop circuits FF, for example, Q or /Q in synchronization with a leading edge of the stopping signal STOP. The delay detecting circuit DLYDET measures an interval between the leading edge of the starting signal START and the leading edge of the stopping signal STOP based on the output levels of the respective flip-flop circuits FF, and outputs the measured interval as the counted value REV.

Before the TDC circuit operates, the starting signal START and the stopping signal STOP may be at a logical level 0. The odd-numbered inverter IV from the input side may output a logical level 1, and the even-numbered inverter IV from the input side may output a logical level 0. The flip-flop circuits FF each output a logical level 0 from the output terminal Q or /Q. If the starting signal START changes from a logical level 0 to a logical level i, the logical levels of the inverters IV are successively inverted starting from the input side, and the output terminals Q or /Q each successively change from the logical level 0 to the logical level 1.

If the interval between the starting signal START and the stopping signal STOP is small, e.g., the number of the flip-flop circuits FF which output a logical level 1 becomes relatively small. If the interval between the starting signal START and the stopping signal STOP is large, e.g., the number of the flip-flop circuits FF which output a logical level 1 becomes relatively large. A borderline between the flip-flop circuit FF which output a logical level a and the flip-flop circuit FF which outputs a logical level 0 may change in accordance with the interval between the starting signal START and the stopping signal STOP.

The delay detecting circuit DLYDET detects the borderline between the flip-flop circuit FF which output a logical level 1 and the flip-flop circuit FF which output a logical level 0 so as to measure the interval between the starting signal START and the stopping signal STOP and to output the measured interval as the counted value REV. The delay detecting circuit DLYDET outputs an end signal EOC in response to the stopping signal STOP.

Figure 4:
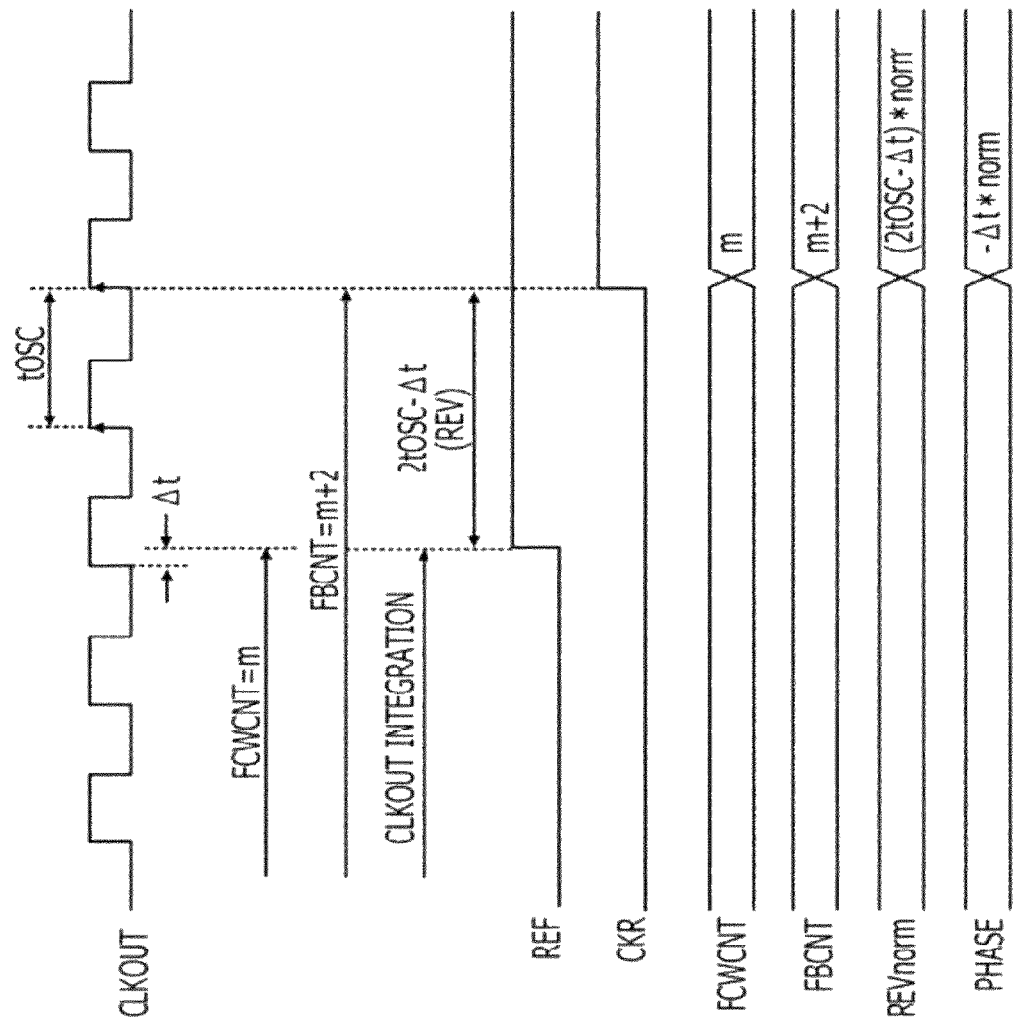
FIG. 4 illustrates an exemplary lock state of a PLL circuit.

FIG. 4 illustrates an exemplary lock state of a PLL circuit. The PLL circuit illustrated in FIG. 4 may be the PLL circuit having the integer multiplying function illustrated in FIG. 1. In a state where the PLL circuit is locked as illustrated in FIG. 4, the phase of the output clock signal CLKOUT may be slightly earlier than the phase of the reference clock signal REF. The counted value REV which indicates an interval between the leading edge of the reference clock signal REF and the leading edge of the clock signal CKR may be "2tOSC−Δt". As the counted values FBCNT and FCWCNT may not be calculated, the counted value REV may be normalized. For example, the counted value REV is divided by a cycle tOSC of the output clock signal CLKOUT so that a ratio to one cycle of the output clock signal CLKOUT is indicated and the counted value REV is normalized. For example, the normalized phase difference REVnorm (=REV*norm) may be indicated by "(2tOSC−Δt)/tOSC". The symbol "*" represents multiplication.

$$CLKOUT \text{ integration} = FBCNT - REVnorm$$
$$= m + 2 - (2tOSC - \Delta t) * \text{norm}$$
$$= m + 2 - (2tOSC - \Delta t)/tOSC$$
$$= m + \Delta t/tOSC$$
$$= m + \Delta t * \text{norm}$$

In FIG. 4, the phase of the clock signal CKR may be behind the phase of the reference clock signal REF by approximately two clock cycles of the output clock signal CLKOUT. If the counted value FCWCNT is "m" in the locked state illustrated in FIG. 4, the counted value FBCNT may be "m+2". The CLKOUT integration in Equation (2) may be indicated as "m+Δt*norm", and the value of the phase difference signal PHASE in Equation (1) may be indicated as "−Δt*norm".

$$PHASE = FCWCNT - CLKOUT \text{ integration}$$
$$= m - (m + \Delta t * \text{norm})$$
$$= -\Delta t * \text{norm}$$

Figure 5:
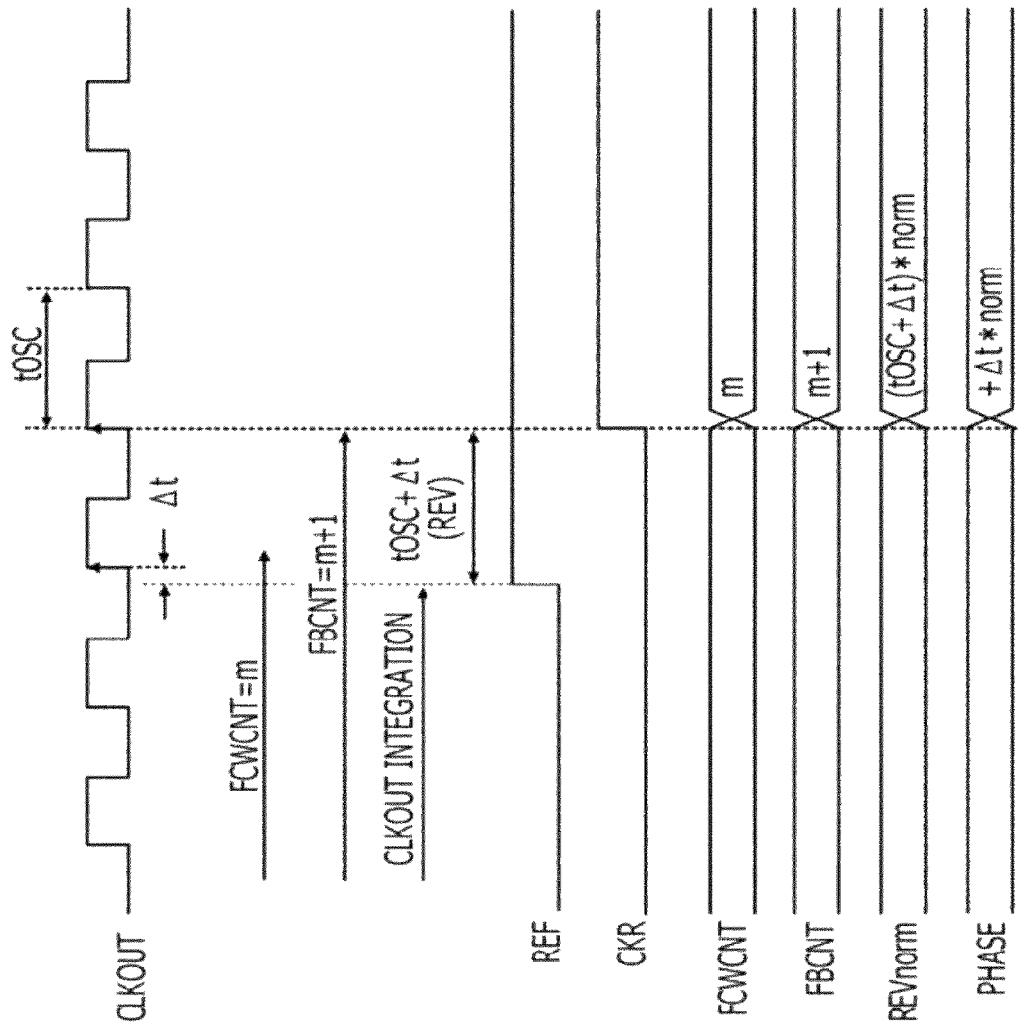
FIG. 5 illustrates an exemplary lock state of a PLL circuit.

FIG. 5 illustrates an exemplary locked-state of a PLL circuit. The PLL circuit illustrated in FIG. 5 may be the PLL circuit including the integer multiplying function illustrated in FIG. 1. In a state where the PLL circuit is locked as illustrated in FIG. 5, the phase of the output clock signal CLKOUT may be slightly later than the phase of the reference clock signal REF. The counted value REV which indicates an interval between the leading edge of the reference clock signal REF and the leading edge of the clock signal CKR may be "tOSC+Δt". The counted value REV is divided by a cycle tOSC of the output clock signal CLKOUT so as to be normalized. The phase difference REVnorm (=REV*norm) may be indicated by "(tOSC+Δt)/tOSC".

$$CLKOUT \text{ integration} = FBCNT - REVnorm$$
$$= m + 1 - (tOSC + \Delta t) * \text{norm}$$
$$= m + 1 - (tOSC + \Delta t)/tOSC$$
$$= m - \Delta t/tOSC$$
$$= m - \Delta t * \text{norm}$$

In FIG. 5, the phase of the clock signal CKR may be later than that of the reference clock signal REF by approximately one clock cycle of the output clock signal CLKOUT. If the counted value FCWCNT is "m" in the locked state illustrated in FIG. 5, the counted value FBCNT is "m+1". The CLKOUT integration in Equation (2) is thereby indicated as "m−Δt*norm", and the value of the phase difference signal PHASE in Equation (1) is indicated as "+Δt*norm".

$$PHASE = FCWCNT - CLKOUT \text{ integration}$$
$$= m - (m - \Delta t * \text{norm})$$
$$= +\Delta t * \text{norm}$$

Figure 6:
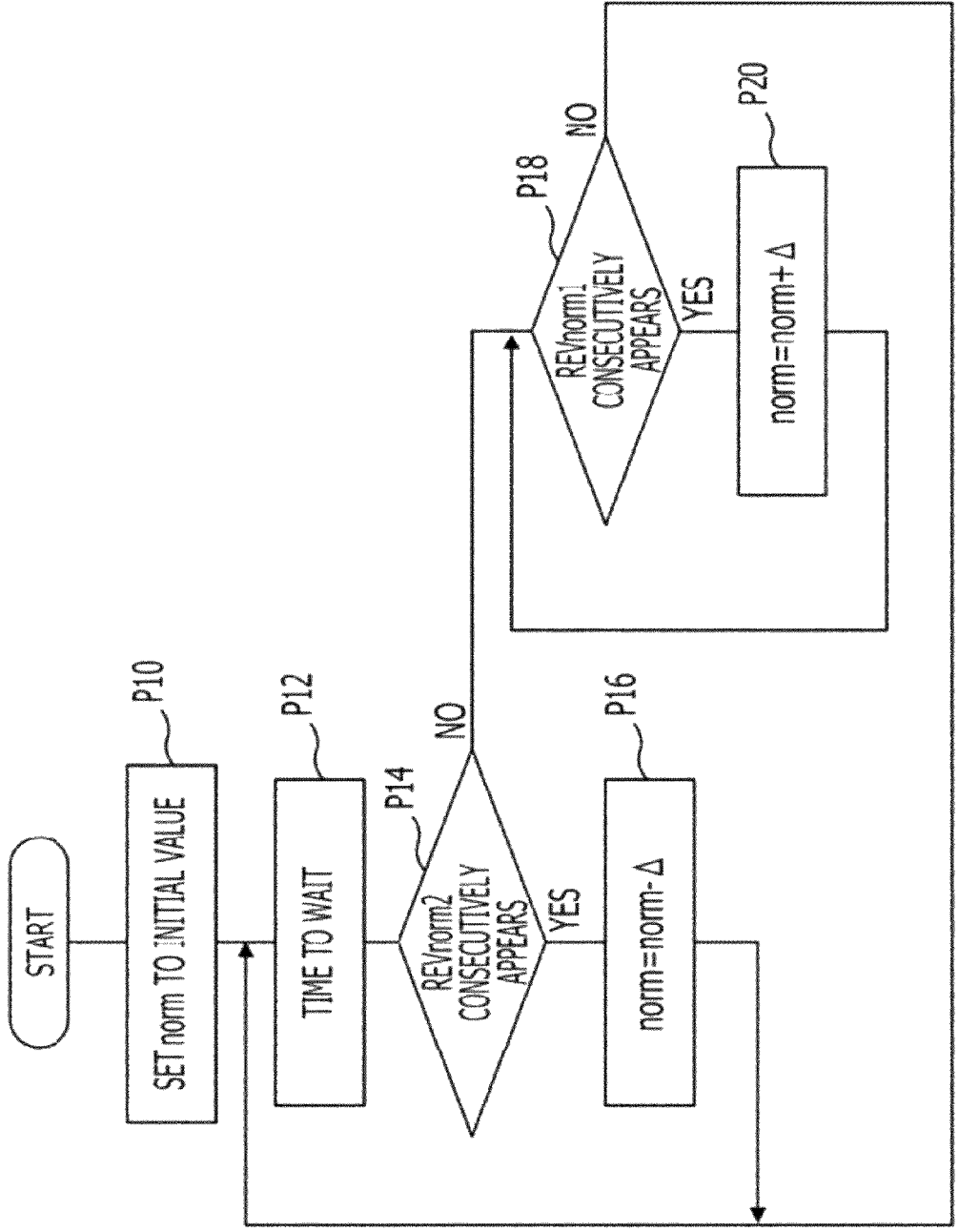
FIG. 6 illustrates an exemplary operation of a logic circuit.

FIG. 6 illustrates an exemplary operation of a logic circuit. The logic circuit LOGIC1 in the phase difference normalizing circuit NRM illustrated in FIG. 1 may operate as illustrated in FIG. 6. The logic circuit LOGIC1 may perform a plurality of operations substantially in parallel. Operations P14 and P16 and operations P18 and P20, e.g., may be performed substantially in parallel by different circuits, for example. An operation P10 may be performed before the PLL circuit is locked. Operations P12-P20 may be performed after the PLL circuit is locked.

The logic circuit LOGIC1 sets the normalizing coefficient norm to an initial value in an operation P10. The initial value of the normalizing coefficient norm may be set in such a way that the phase difference REVnorm becomes larger than "1" and smaller than "2". A period of time to wait for a negative feedback loop of the PLL circuit to be steadied may be put in an operation P12.

The logic circuit LOGIC1 may calculate consecutive times the phase difference REVnorm indicating "2" appears in operations P14 and P16. For example, when the value "2" appears consecutive times, the normalizing coefficient norm becomes smaller by a value Δ. The logic circuit LOGIC1 may calculate consecutive times the phase difference REVnorm indicating "1" appears in operations P18 and P20. For example, when the value "1" appears consecutive times, the normalizing coefficient norm becomes larger by a value Δ. The detected consecutive times may be 16 times, for example.

The operations P14 and P16 and the operations P18 and P20 are repeated and the normalizing coefficient norm is adjusted so that the phase difference REVnorm having a value "1" or "2" may appear at random. The states illustrated in FIGS. 4 and 5 may appear at random. When the phase difference REVnorm having a value "1" or "2" appears at random, e.g., the phase difference normalizing circuit NRM may generate a correct normalizing coefficient norm. The normalizing coefficient norm may be more precise and the PLL circuit may operate more precisely.

Figure 7:
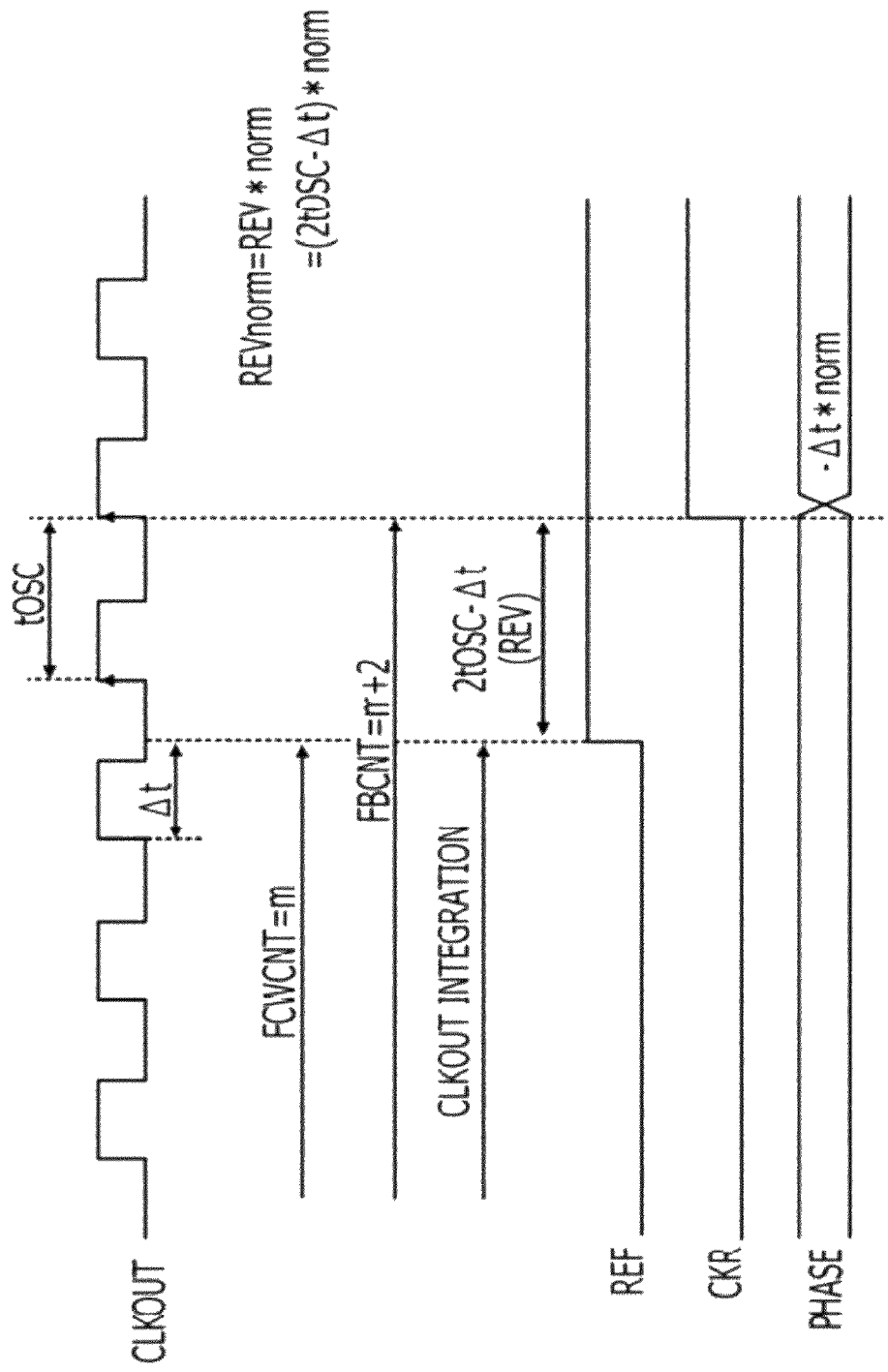
FIG. 7 illustrates an exemplary operation of a PLL circuit.

FIG. 7 illustrates an exemplary operation of a PLL circuit. The PLL circuit including the integer multiplying function illustrated in FIG. 1 may operate as illustrated in FIG. 7. The operation illustrated in FIG. 7 may be an operation performed after the PLL circuit is locked and before the normalizing coefficient norm is corrected. The PLL circuit is locked in FIG. 7 when the phase difference between the reference clock signal REF and the clock signal CKR stays between one cycle and two cycles of the output clock signal CLKOUT. When the normalizing coefficient norm is larger than an expected value "tLSB/tOSC", the phase difference REVnorm indicating "2" may be consecutively generated. The value tLSB may correspond to the resolution capability of the TDC circuit illustrated in FIG. 3. For example, when the logic circuit LOGIC1 illustrated in FIG. 1 consecutively detects the state illustrated in FIG. 7, the normalizing coefficient norm may become small in the operation P16 illustrated in FIG. 6.

Figure 8:
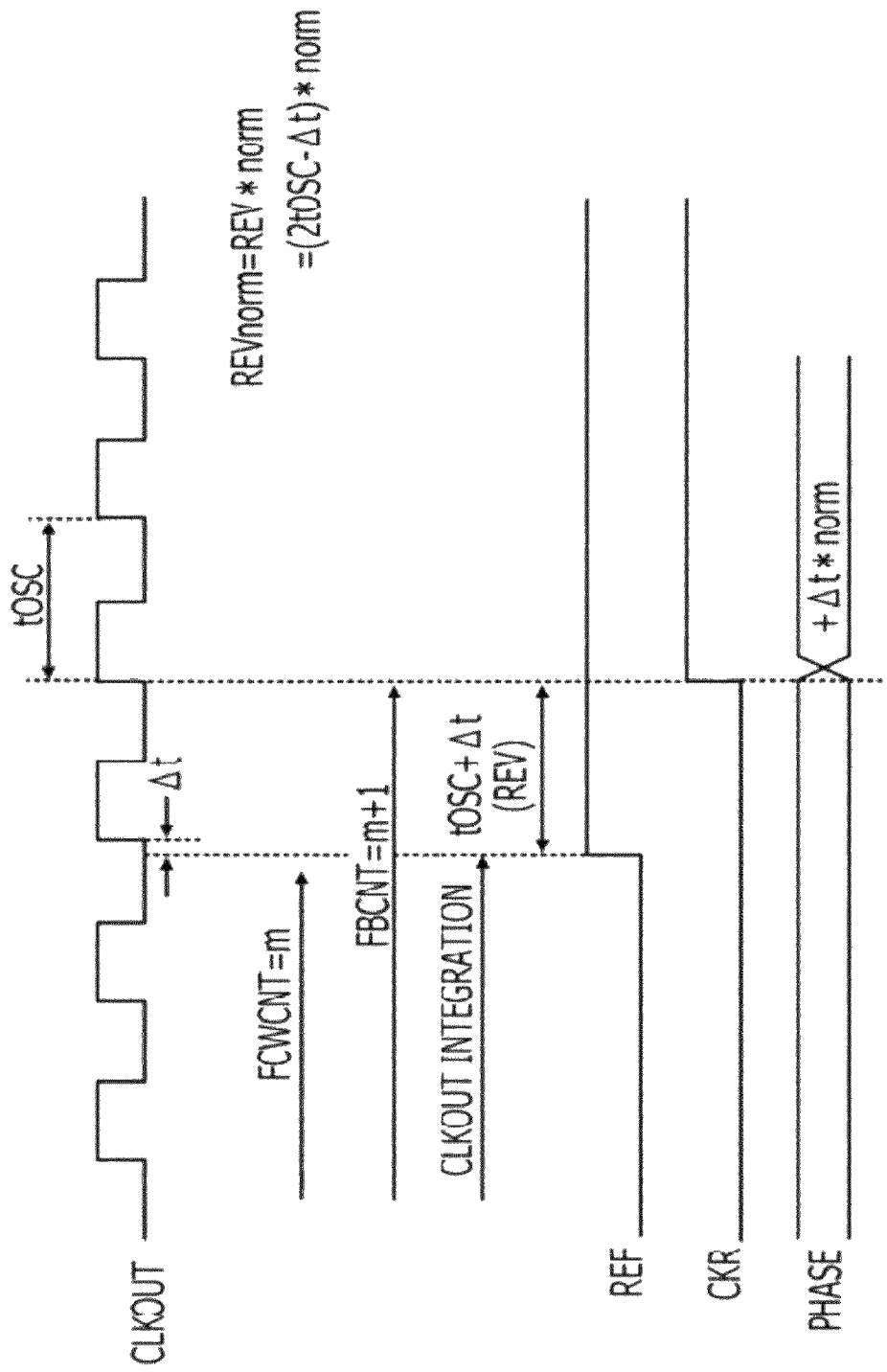
FIG. 8 illustrates an exemplary operation of a PLL circuit.

FIG. 8 illustrates an exemplary operation of a PLL circuit. The PLL circuit including the integer multiplying function illustrated in FIG. 1 may operate as illustrated in FIG. 8. The operation illustrated in FIG. 8 may be an operation performed after the PLL circuit is locked and before the normalizing coefficient norm is corrected. The PLL circuit is locked in FIG. 8 when the phase difference between the reference clock signal REF and the clock signal CKR stays between one cycle and two cycles of the output clock signal CLKOUT. When the normalizing coefficient norm is smaller than the expected value "tLSB/tOSC", the phase difference REVnorm indicating "1" may be consecutively generated. When the logic circuit LOGIC1 illustrated in FIG. 1 consecutively detects the state illustrated in FIG. 8, the normalizing coefficient norm may become large in the operation P20 illustrated in FIG. 6.

Figure 9:
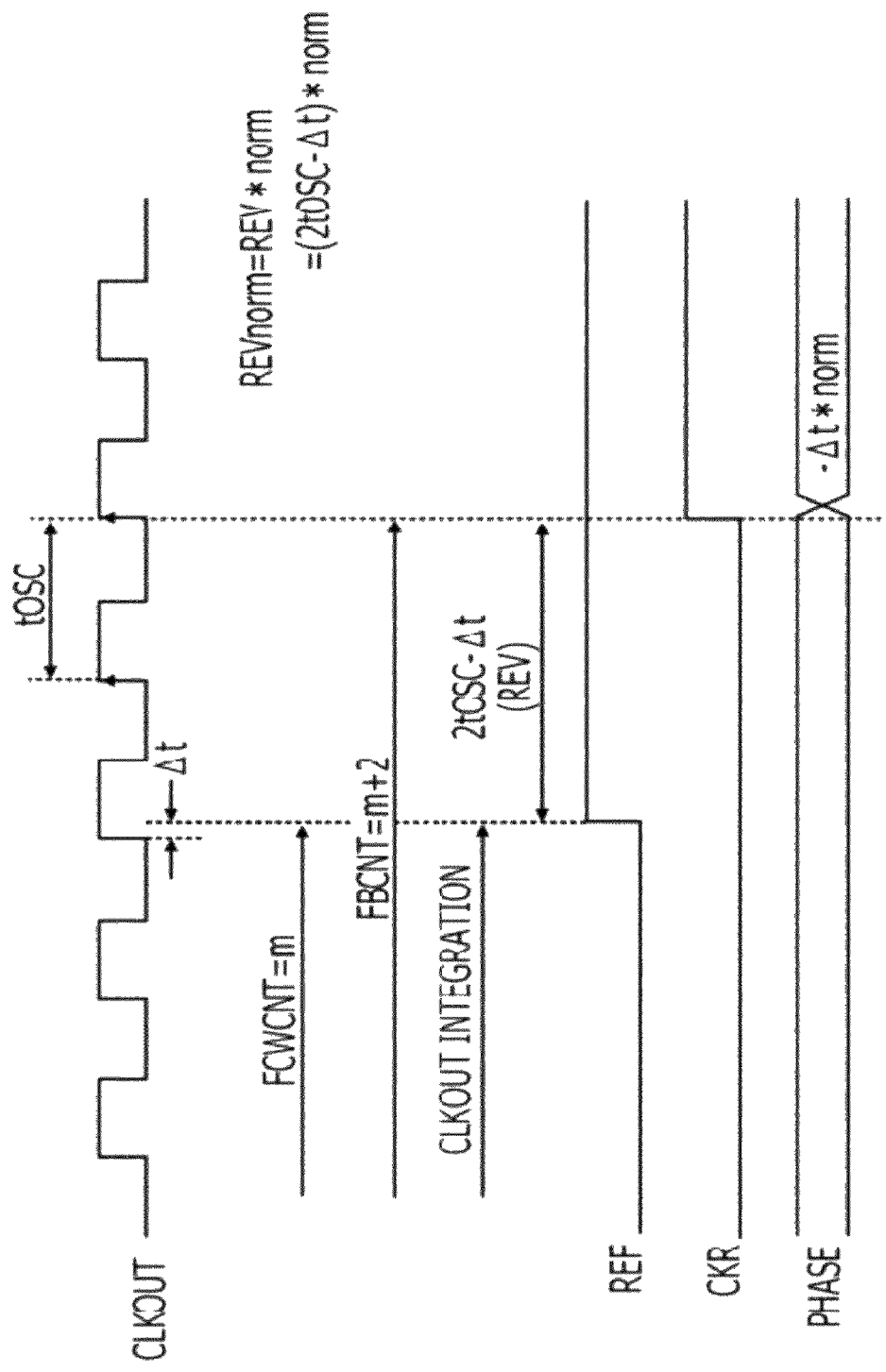
FIG. 9 illustrates an exemplary operation of a PLL circuit.

FIG. 9 illustrates an exemplary operation of a PLL circuit. The PLL circuit including the integer multiplying function illustrated in FIG. 1 may operate as illustrated in FIG. 9. The operation illustrated in FIG. 9 may be an operation performed after the normalizing coefficient norm is corrected. The PLL circuit is locked in FIG. 9 when the phase difference between the reference clock signal REF and the clock signal CKR substantially equals two cycles of the output clock signal CLKOUT. The normalizing coefficient norm may substantially equal the expected value "tLSB/tOSC". When the phase of the output clock signal CLKOUT is earlier than the phase of the reference clock signal REF, the phase difference REVnorm indicating "2" may be generated.

Figure 10:
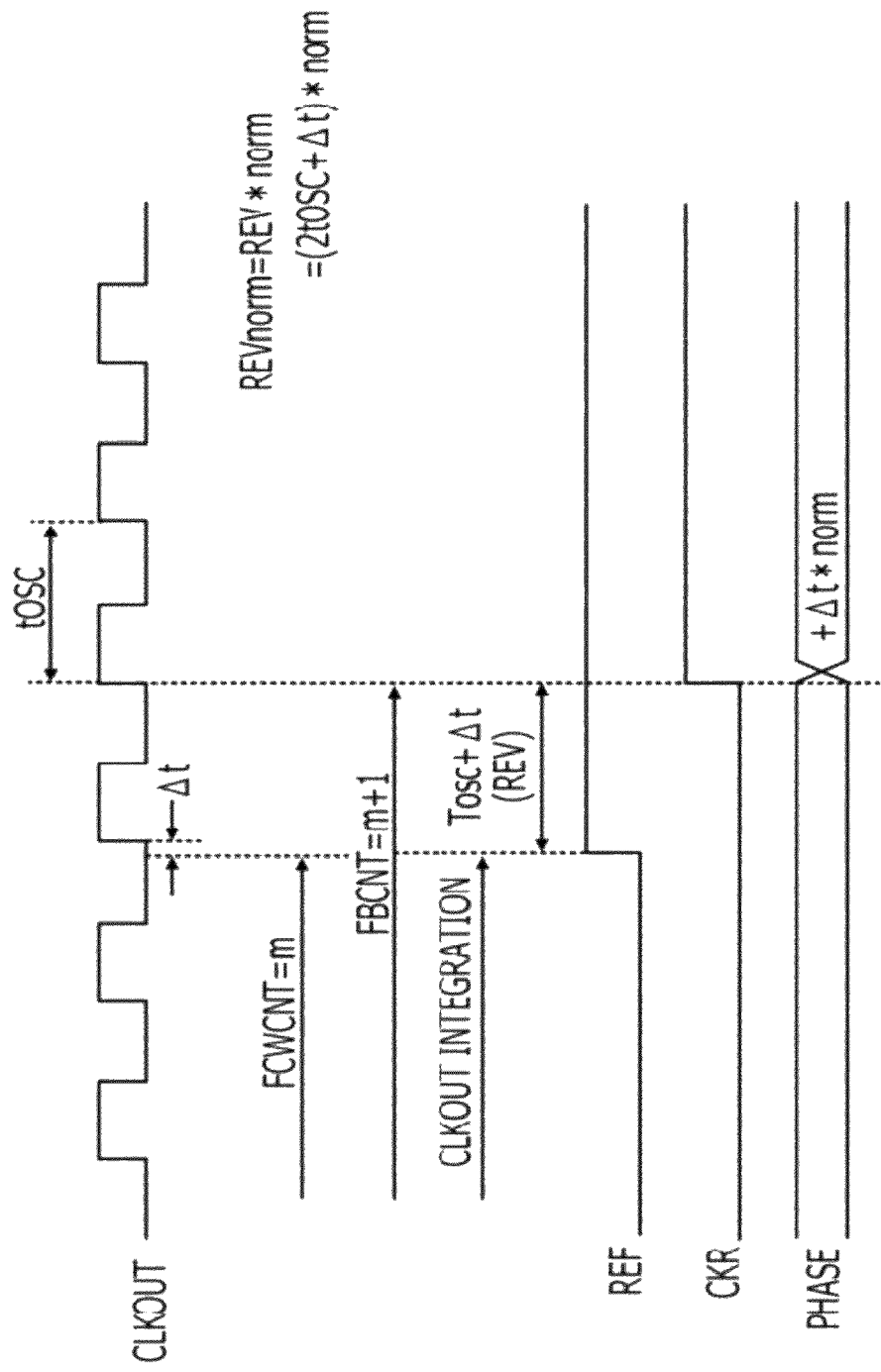
FIG. 10 illustrates an exemplary operation of a PLL circuit.

FIG. 10 illustrates an exemplary operation of a PLL circuit. The PLL circuit including the integer multiplying function illustrated in FIG. 1 may operate as illustrated in FIG. 10. The operation illustrated in FIG. 10 may be an operation performed after the normalizing coefficient norm is corrected. The PLL circuit is locked in FIG. 10 when the phase difference between the reference clock signal REF and the clock signal CKR substantially equals one cycle of the output clock signal CLKOUT. The normalizing coefficient norm may substantially equal the expected value "tLSB/tOSC". When the phase of the output clock signal CLKOUT is later than the phase of the reference clock signal REF, the phase difference REVnorm indicating "1" may be generated.

If the normalizing coefficient norm approaches the expected value "tLSB/tOSC" in adjustment of the normalizing coefficient norm of the logic circuit LOGIC1 illustrated in FIG. 6, the normalizing coefficient norm is set to "1" or "2" at random and the state illustrated in FIG. 9 or FIG. 10 appears at random. The PLL circuit may be an integer multiplying circuit. The counted values FCWCNT and FBCNT and the frequency command word FCW may be integers. The phase difference REVnorm may be an integer so that the PLL circuit converges on the locked state.

Figure 11:
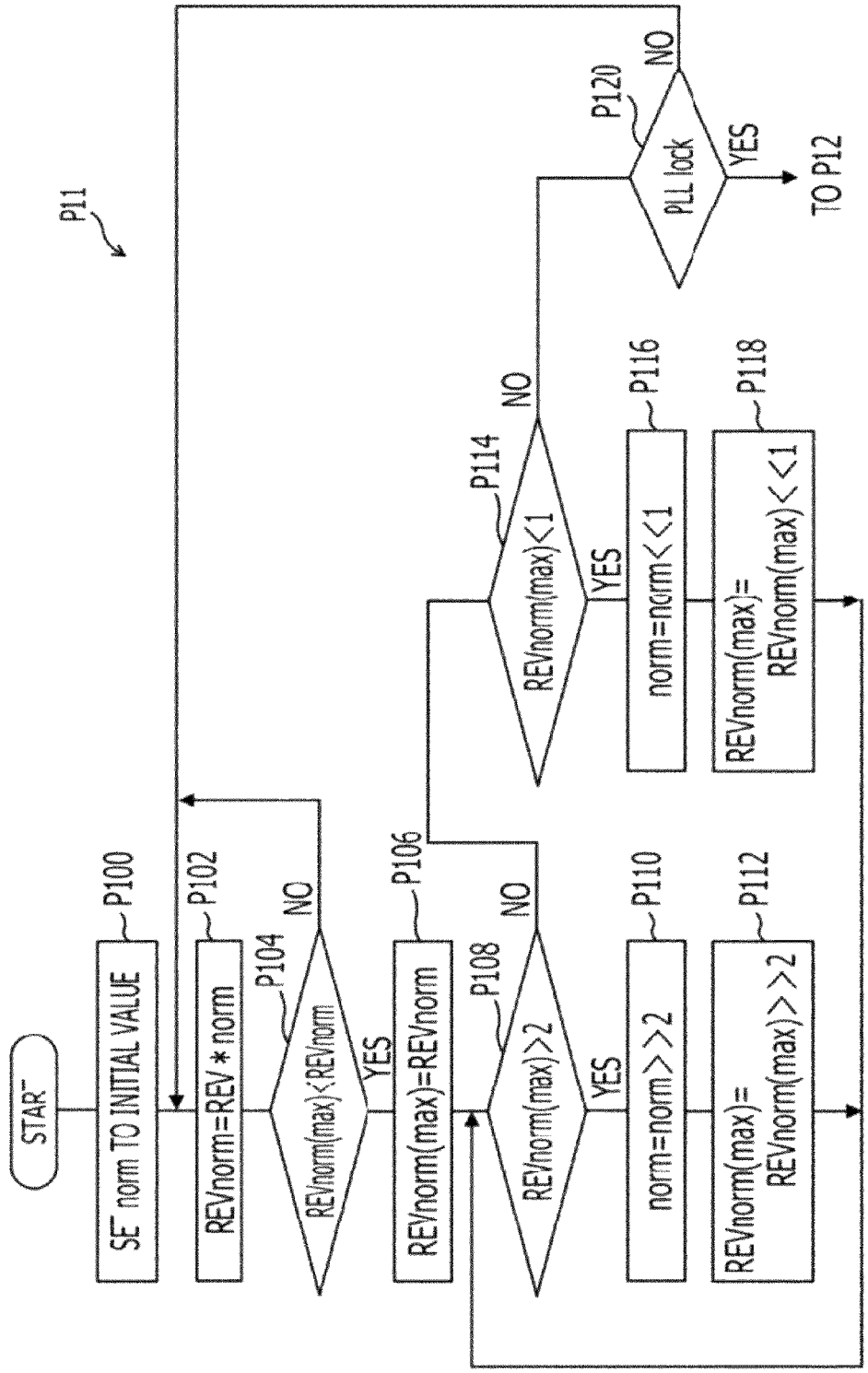
FIG. 11 illustrates an exemplary operation of a logic circuit.

FIG. 11 illustrates an exemplary operation of a logic circuit. The logic circuit LOGIC1 of the phase difference normalizing circuit NRM of the PLL circuit having the integer multiplying function illustrated in FIG. 1 may operate as illustrated in FIG. 11. The PLL circuit may not be locked in FIG. 11. A process P11 illustrated in FIG. 11 may be performed instead of the process P10 illustrated in FIG. 6.

In FIG. 6, e.g., the normalizing coefficient norm may be set to an initial value in the process P10 so that the normalizing coefficient norm is adjusted. The initial value of the normalizing coefficient norm for setting the phase difference REVnorm to be larger than "1" and smaller than "2" may not be accurately calculated in advance.

When the initial value of the normalizing coefficient norm is larger than twice the expected value "tLSB/tOSC", e.g., the phase difference REVnorm which is larger than "3" may consecutively appear. For example, in the operation P14, P16, P18 or P20 illustrated in FIG. 6, the normalizing coefficient norm may not be pulled to a correct value. When the initial value of the normalizing coefficient norm is smaller than half the expected value "tLSB/tOSC", the operation of the PLL circuit may become unsteady as the phase difference REVnorm becomes equal to or smaller than "1".

The operation P11 illustrated in FIG. 11 may be performed instead of the operation P10 illustrated in FIG. 6, so that the logic circuit LOGIC1 may automatically calculate an initial value of the normalizing coefficient norm which makes the phase difference REVnorm larger than "1" and smaller than "2".

After the normalizing coefficient norm is set to an initial value in an operation P100, the counted value REV generated by the TDC circuit is multiplied by the normalizing coefficient norm so that the phase difference REVnorm is calculated.

The phase difference REVnorm is compared with a maximum value REVnorm(max) in an operation P104. An initial value of the maximum value REVnorm(max) may be "0". When the phase difference REVnorm is equal to or smaller than the maximum value REVnorm(max), the process returns to the operation P102. When the counted value REV is updated, the counted value REV is multiplied by the normalizing coefficient norm so that the phase difference REVnorm is calculated again. When the phase difference REVnorm is larger than the maximum value REVnorm(max), the maximum value REVnorm(max) is replaced with the phase difference REVnorm in an operation P106.

When the maximum value REVnorm(max) is larger than "2" in an operation P108, the normalizing coefficient norm is halved in an operation P110. A symbol ">>" indicated in the drawing represents an operation of one-bit shift to the less significant side. The maximum value REVnorm(max) is halved in an operation P112. The operation P108 may be performed again after the operation P112.

When the maximum value REVnorm(max) is equal to or smaller than "2" in the operation P108 and the maximum value REVnorm(max) is smaller than "1" in an operation P114, the normalizing coefficient norm is doubled in an operation P116. A symbol "<<" indicated in the drawing represents an operation of one-bit shift to the more significant side. The maximum value REVnorm(max) is doubled in an operation P118. The operation P108 may be performed again after the operation P118.

When the maximum value REVnorm(max) is larger than "1" and smaller than "2", whether the PLL circuit is locked or not is identified in an operation P120. When the PLL circuit is locked, the process following the operation P12 illustrated in FIG. 6 may be performed. When the PLL circuit is not locked, the process returns to the operation P102 and the counted value REV is multiplied by the normalizing coefficient norm so that the phase difference REVnorm is calculated again.

When the initial value of the normalizing coefficient norm is larger than twice the expected value "tLSB/tOSC" or smaller than half the expected value "tLSB/tOSC" before the PLL circuit is locked, the normalizing coefficient norm is initially adjusted so that the phase difference REVnorm stays between "1" and "2". The normalizing coefficient norm may be pulled into a correct value of the expected value "tLSB/tOSC" by the operations P12-P20 illustrated in FIG. 6.

Figure 12:
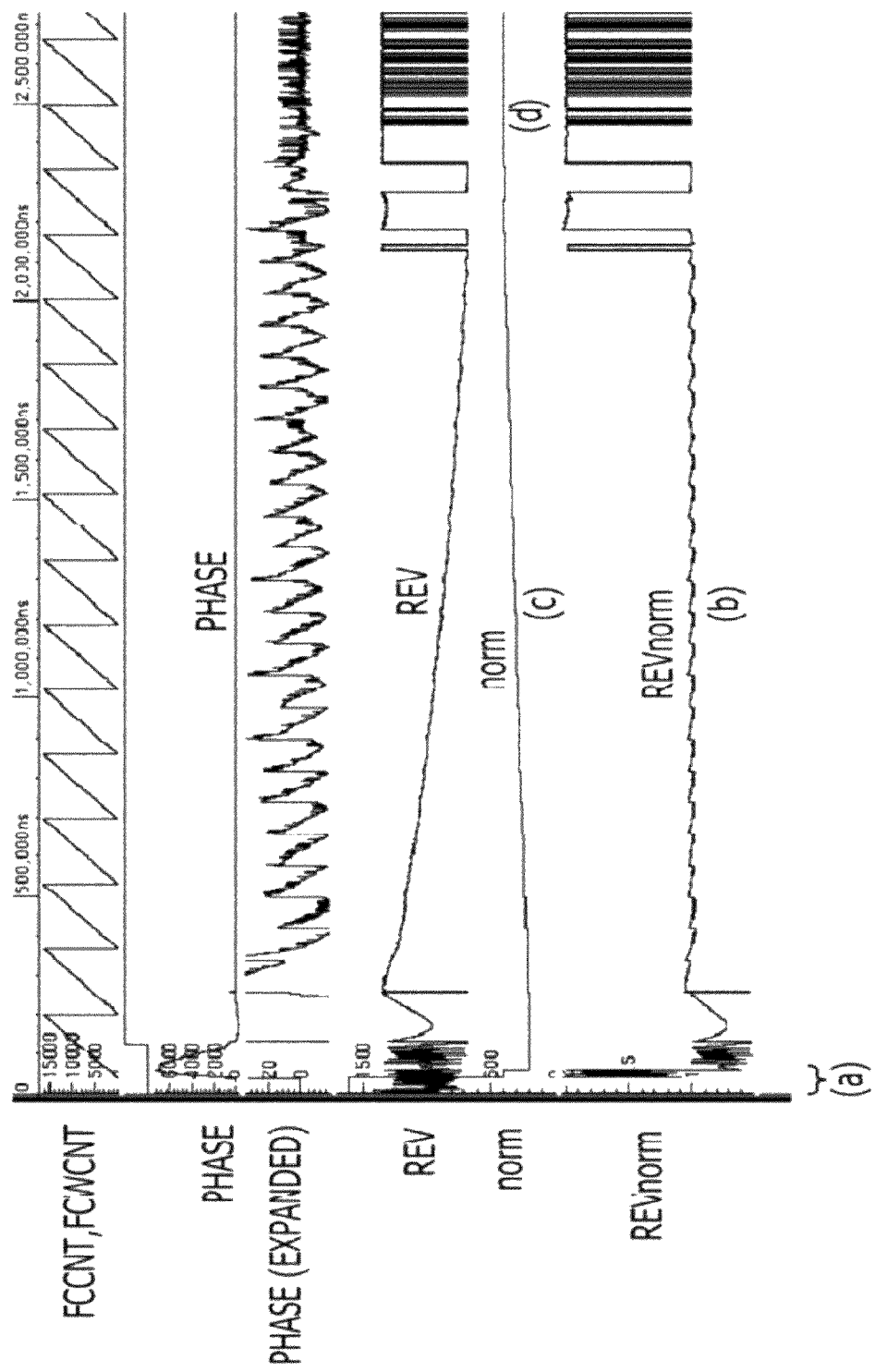
FIG. 12 illustrates an exemplary simulated waveform.

FIG. 12 illustrates an exemplary simulated waveform. The simulated waveform illustrated in FIG. 12 may be a simulated waveform in the PLL circuit including the phase difference normalizing circuit NRM which performs the operation illustrated in FIG. 11. When starting an operation in FIG. 12, e.g., the PLL circuit may perform the operation P11 illustrated in FIG. 11. The phase difference REVnorm may be initially set to a value larger than "1" and smaller than "2" as indicated by (a) in FIG. 12. The phase difference REVnorm may be initially set to an integer value "1". The operations P14, P16, P18 and P20 illustrated in FIG. 6 may be performed.

As indicated by (b) in FIG. 12, the phase difference REVnorm may indicate "1" for a certain period of time. As indicated by (c) in FIG. 12, the logic circuit LOGIC1 may increase the normalizing coefficient norm in the operations P18 and P20 illustrated in FIG. 6. When the phase difference REVnorm being "1" or "2" appears at random, the logic circuit LOGIC1 determines that the phase of the output clock signal CLKOUT is substantially coincident with the phase of the reference clock signal REF and stops updating the normalizing coefficient norm as indicated by (d) in FIG. 12. The normalizing coefficient norm may be pulled into the expected value "tLSB/tOSC" so as to become a substantially certain value.

In the PLL circuit having the integer multiplying function, the simplified logic circuit LOGIC1 which may not include a dividing circuit or an averaging circuit precisely normalizes the counted value REV and sets the normalizing coefficient norm to a correct value. The phase difference Δt between the reference clock signal REF and the output clock signal CLKOUT may be minimized and the PLL circuit may be precisely locked.

The value of the phase difference REVnorm when the PLL circuit is locked may substantially be set to "1" or "2" by the flip-flop circuits FF1 and FF2 coupled in series. As illustrated in FIG. 6, the operation of the logic circuit LOGIC1 for setting the normalizing coefficient norm to a certain value may be simplified.

When the PLL circuit starts operation, the normalizing coefficient norm may be automatically initially adjusted so that the phase difference REVnorm stays between "1" and "2". Thus, the normalizing coefficient norm may be set to a certain value regardless of the initial value of the phase difference REVnorm. The logic circuit LOGIC1 may not have a large dividing circuit or a large averaging circuit. For example, the simplified logic circuit LOGIC1 performs the operation illustrated in FIG. 6 or FIG. 11 so that the PLL circuit may precisely be locked.

Figure 13:
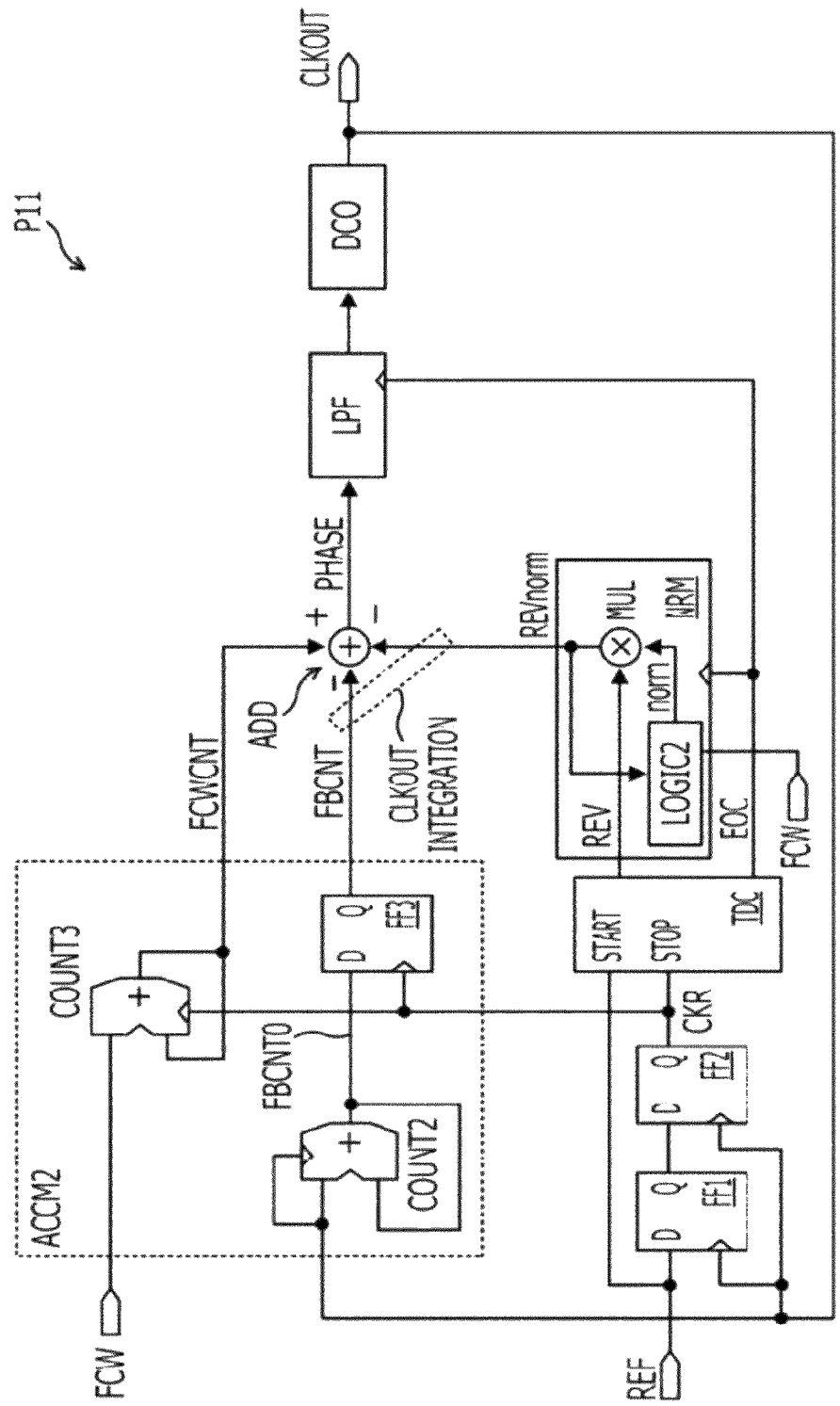
FIG. 13 illustrates an exemplary PLL circuit.

FIG. 13 illustrates an exemplary PLL circuit. The PLL circuit illustrated in FIG. 13 may have a fraction multiplying function. The PLL circuit may be, e.g., an All Digital Phase-Locked Loop (ADPLL) circuit. In FIG. 13, an element which is substantially the same as or similar to that illustrated in FIG. 1 is given a same reference numeral, and the description may be omitted or reduced.

The PLL circuit having a fraction multiplying function may include an accumulator ACCM2 for fraction multiplication use instead of the accumulator ACCM1 for integer multiplication use illustrated in FIG. 1. A counter COUNT3 in the accumulator ACCM2 accumulates a frequency command word FCW including a value below the decimal point in synchronization with the clock signal CKR, and outputs the accumulated frequency command word as a counted value FCWCNT. The PLL circuit may include a logic circuit LOGIC2 for fraction multiplication use instead of the logic circuit LOGIC1 for integer multiplication use illustrated in FIG. 1. The logic circuit LOGIC2 operates upon receiving the phase difference REVnorm and the frequency command word FCW. The operation of the logic circuit LOGIC2 may be substantially the same as or similar to an operation illustrated in FIG. 18. Other elements illustrated in FIG. 13 may be substantially the same as or similar to those illustrated in FIG. 1.

Figure 14:
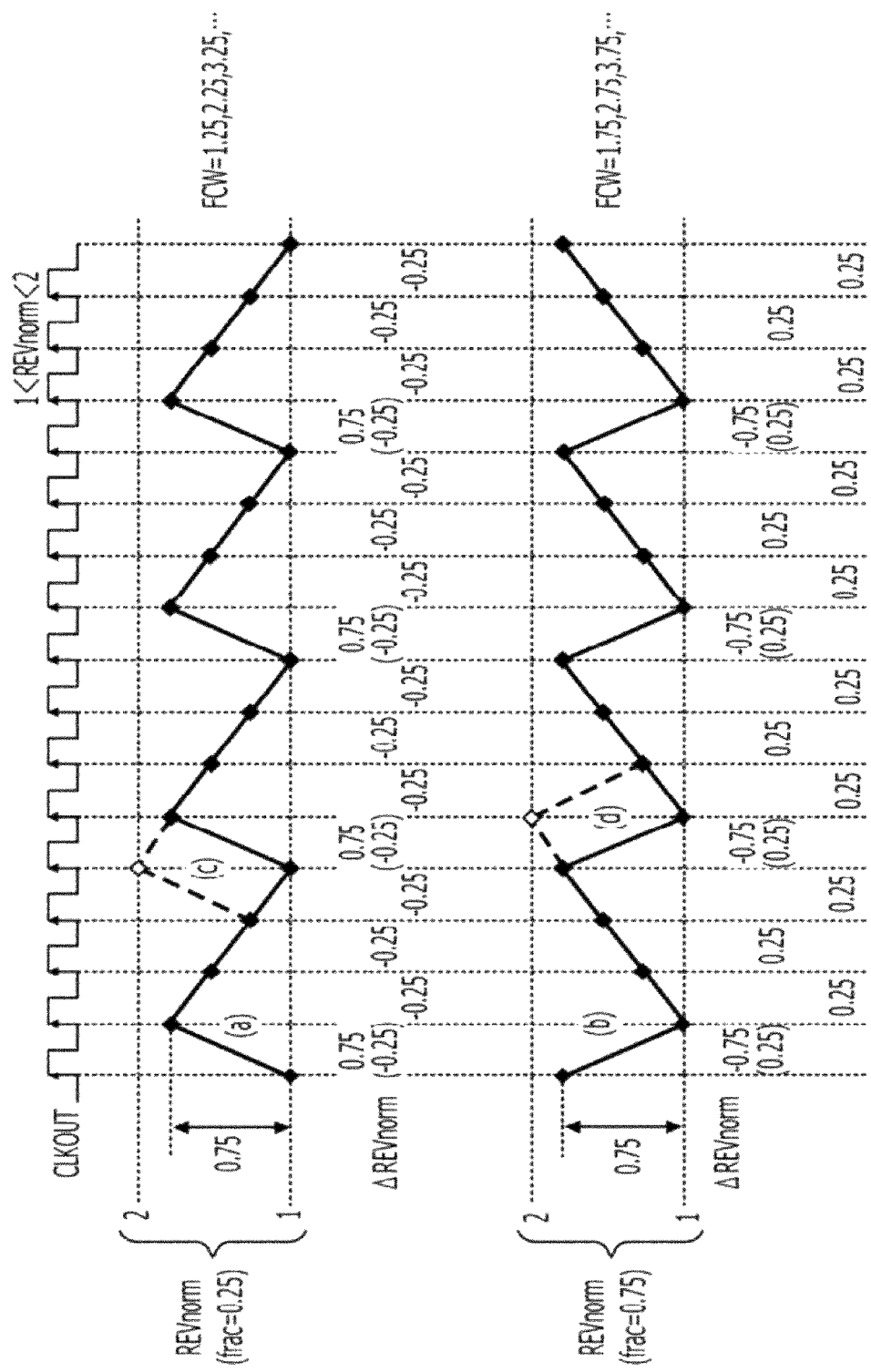
FIG. 14 illustrates an exemplary phase difference.

FIG. 14 illustrates an exemplary phase difference. The phase difference illustrated in FIG. 14 may be a phase difference REVnorm of the PLL circuit having the fraction multiplying function illustrated in FIG. 13. FIG. 14 illustrates a change of the phase difference REVnorm when the normalizing coefficient norm is the expected value tLSB/tOSC.

Since the phase difference REVnorm is within a range between 1 and 2 when the normalizing coefficient norm is the expected value tLSB/tOSC, the phase difference REVnorm may periodically overflow and turn back. A change of the phase difference REVnorm when a fractional portion frac is equal to or smaller than "0.5" and a change of the phase difference REVnorm when the fractional portion frac is larger than "0.5" may differ from each other. In FIG. 14, the fractional portion frac may be 0.25 (frac=0.25) or 0.75 (frac=0.75).

As to a difference ΔREVnorm between two consecutive phase differences REVnorm, the difference ΔREVnorm (absolute value) at a time when the phase difference REVnorm overflows and turns back when the fractional portion frac is 0.25 or 0.75 may be 0.75 as indicated by a and b in FIG. 14. The phase difference REVnorm may turn back at close to 2 and 1. The difference ΔREVnorm (absolute value) at a time when the phase difference REVnorm turns back may be "0.75" as indicated by c and d in FIG. 14. When the phase difference REVnorm does not turn back and the normalizing coefficient norm substantially equals the expected value tLSB/tOSC, the difference ΔREVnorm may be a certain value, e.g., −0.25 or 0.25.

Figure 15:
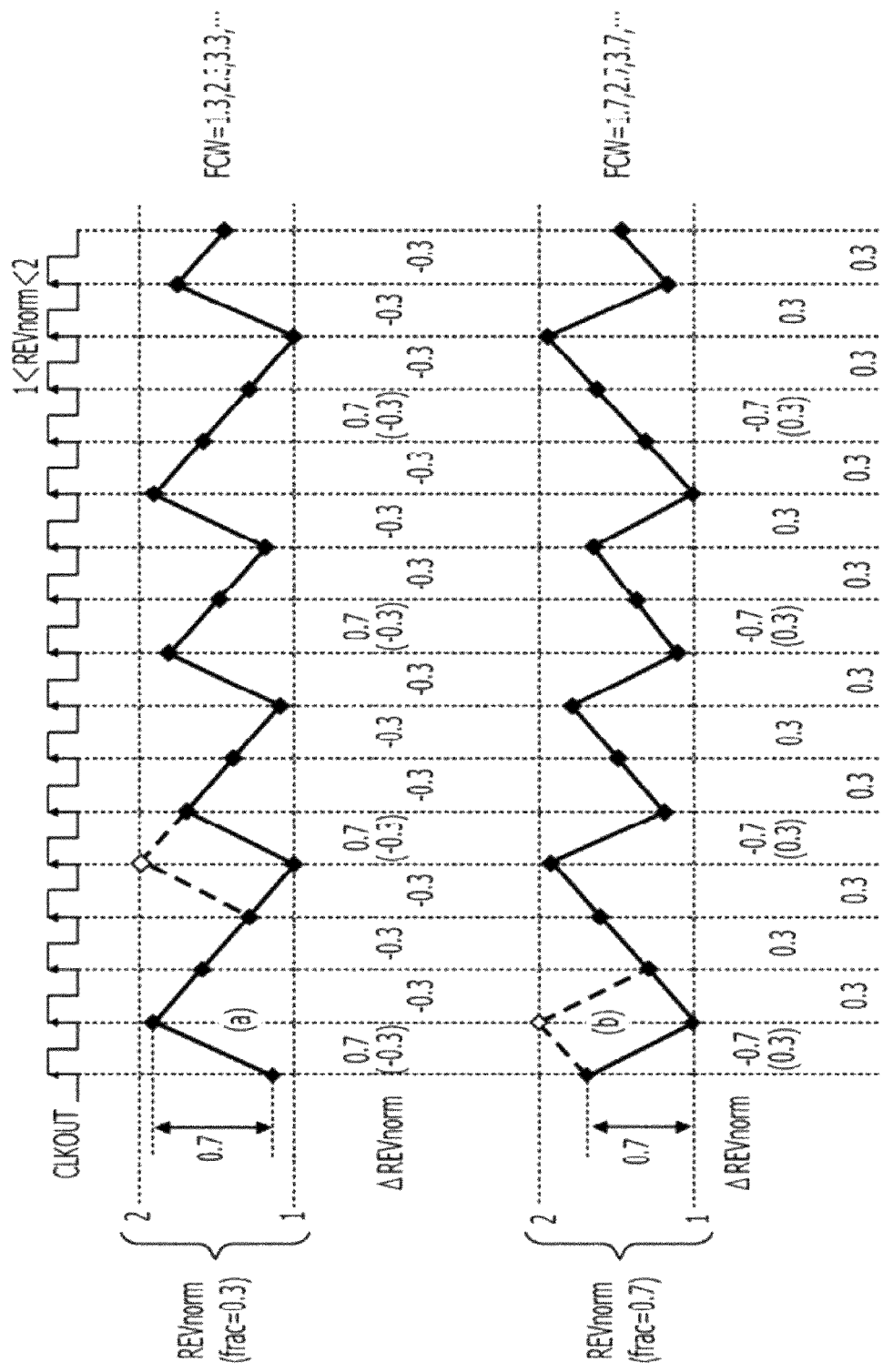
FIG. 15 illustrates an exemplary change of a phase difference.

FIG. 15 illustrates an exemplary change of a phase difference. The phase difference illustrated in FIG. 15 may be the phase difference REVnorm of the PLL circuit having the fraction multiplying function illustrated in FIG. 13. When the normalizing coefficient norm is the expected value tLSB/tOSC in FIG. 15, the fractional portion frac may be 0.3 or 0.7.

In FIG. 15, similarly as in FIG. 14, a difference ΔREVnorm (absolute value) at a time when the phase difference REVnorm overflows and turns back when the fractional portion frac is 0.3 or 0.7 may be 0.7 as indicated by a and b in FIG. 15. When the phase difference REVnorm does not turn back and the normalizing coefficient norm substantially equals the expected value tLSB/tOSC, the difference ΔREVnorm may be a certain value, e.g., −0.3 or 0.3.

Figure 16:
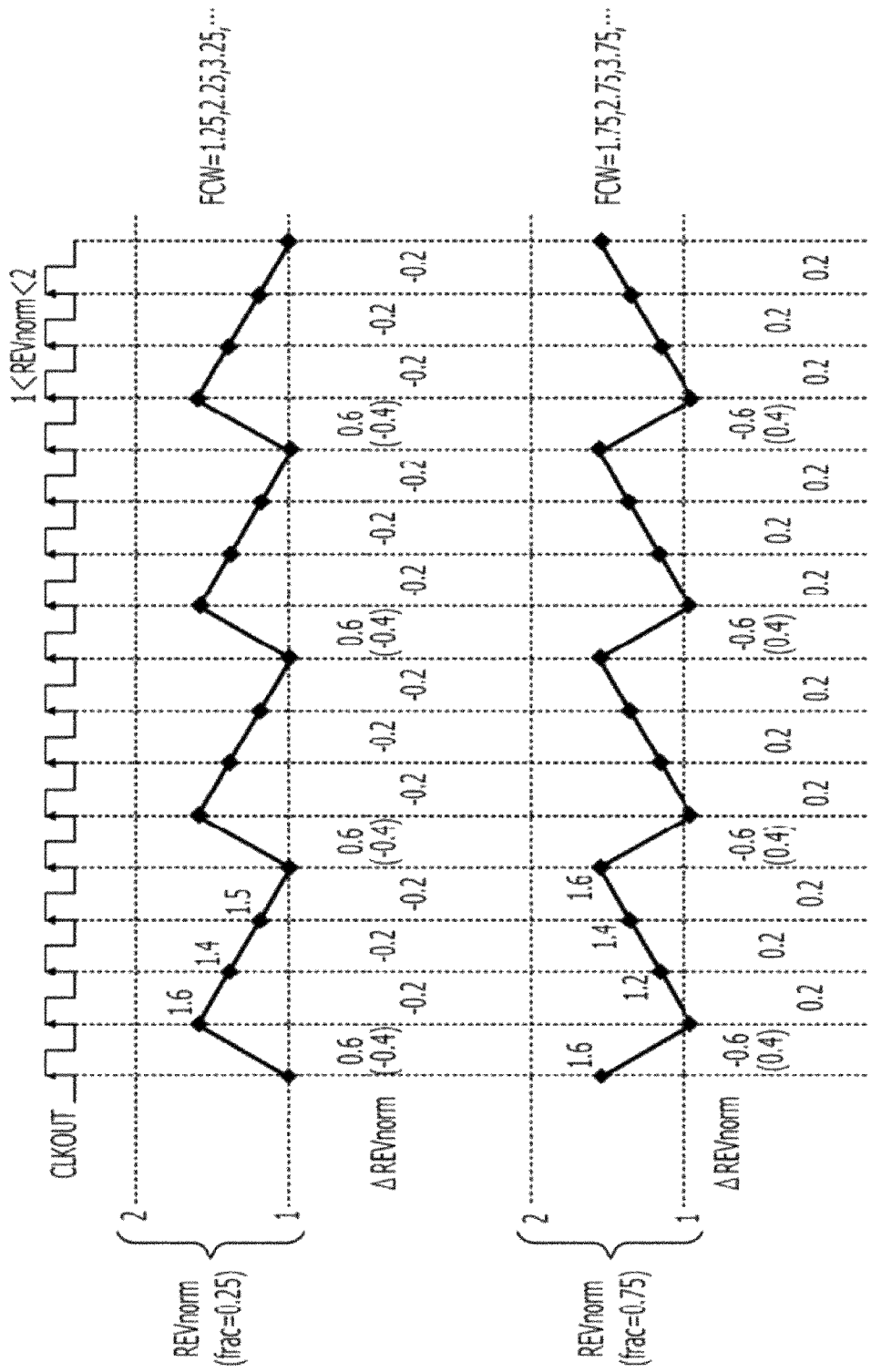
FIG. 16 illustrates an exemplary change of a phase difference.

FIG. 16 illustrates an exemplary change of a phase difference. The phase difference illustrated in FIG. 16 may be the phase difference REVnorm of the PLL circuit having the fraction multiplying function illustrated in FIG. 13. The normalizing coefficient norm may be smaller than the expected value tLSB/tOSC, e.g., 0.8 times as large as the expected value tLSB/tOSC. When the fractional portion frac is 0.25, the difference ΔREVnorm may periodically be smaller than 1-frac, e.g., 0.6. When the phase difference REVnorm does not turn back, a maximum value of the difference ΔREVnorm may be −0.4, and an average value of the difference ΔREVnorm may be −0.25.

When the fractional portion frac is 0.75, the absolute value of the difference ΔREVnorm may periodically be smaller than the fractional portion frac, e.g., 0.6. When the phase difference REVnorm does not turn back, a maximum value of the difference ΔREVnorm may be 0.4, and an average value of the difference ΔREVnorm may be 0.25.

Figure 17:
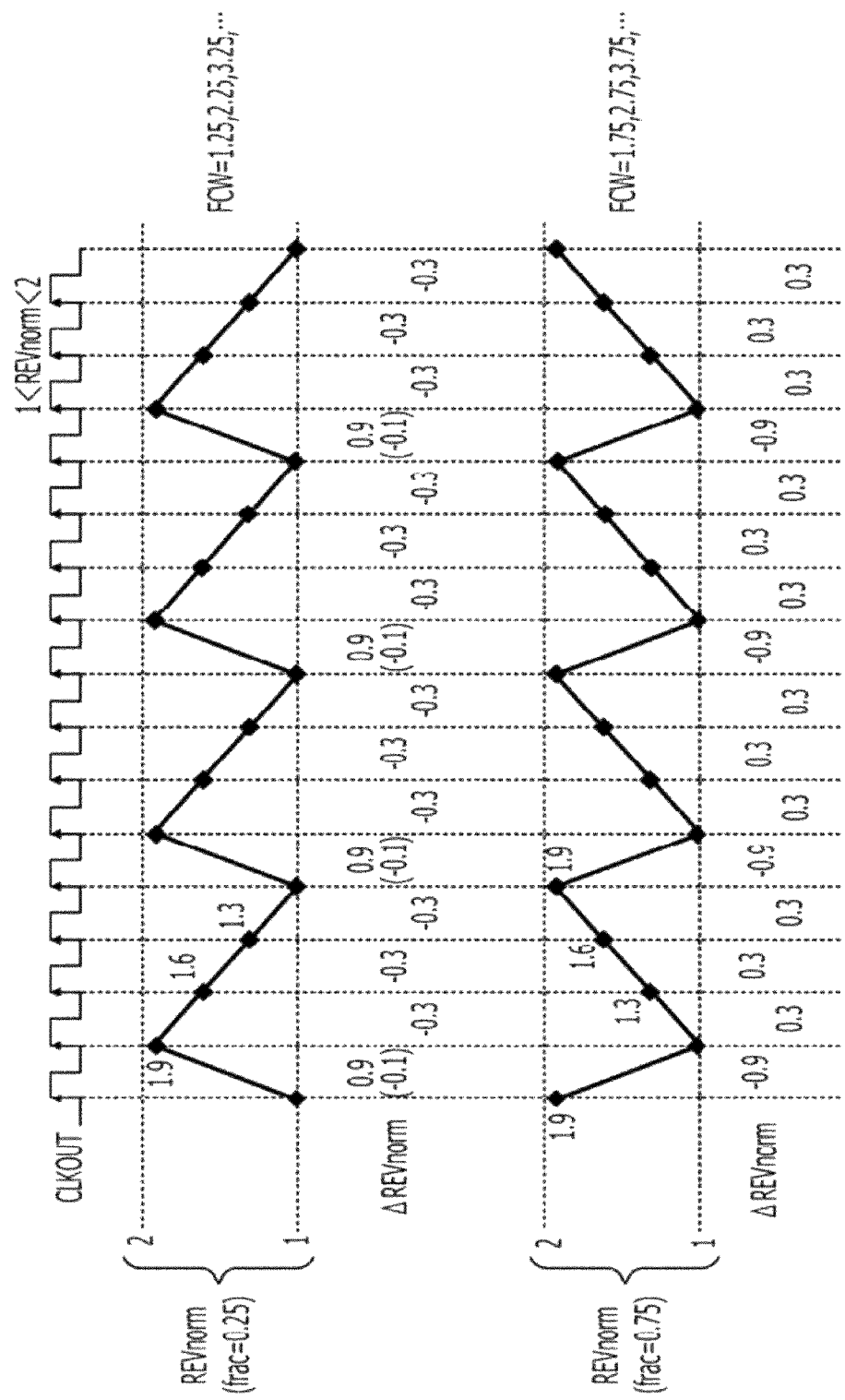
FIG. 17 illustrates an exemplary change of a phase difference.

FIG. 17 illustrates an exemplary change of a phase difference. The phase difference illustrated in FIG. 17 may be the phase difference REVnorm of the PLL circuit having the fraction multiplying function illustrated in FIG. 13. The normalizing coefficient norm may be larger than the expected value tLSB/tOSC, e.g., 1.2 times as large as the expected value tLSB/tOSC. When the fractional portion frac is 0.25, the difference ΔREVnorm may periodically be larger than 1-frac, e.g., 0.9. When the fractional portion frac is 0.75, the absolute vale of the difference ΔREVnorm may periodically be larger than the fractional portion frac, e.g., 0.9.

Figure 18:
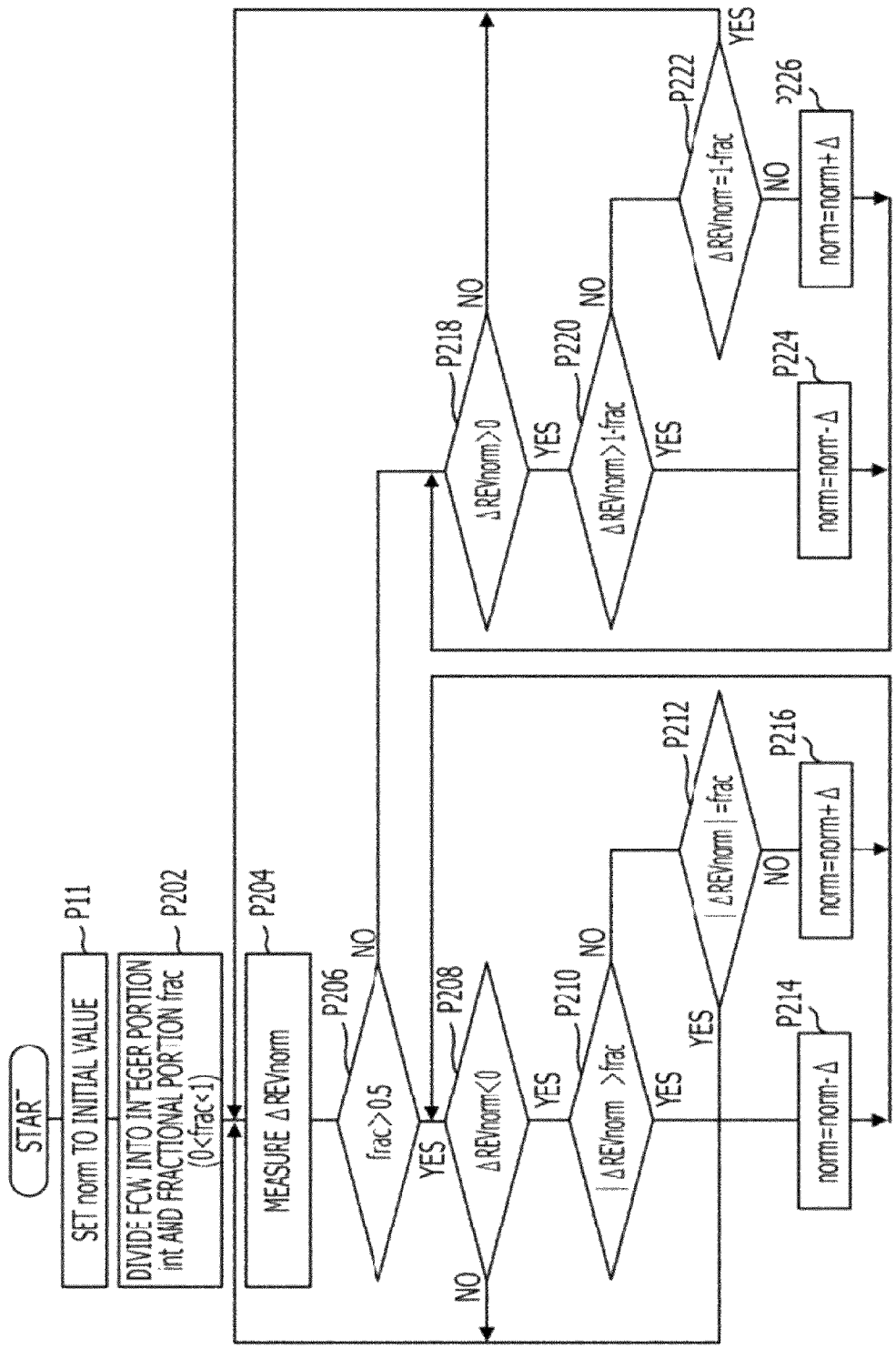
FIG. 18 illustrates an exemplary operation of a logic circuit.

FIG. 18 illustrates an exemplary operation of a logic circuit. The logic circuit LOGIC2 in the phase difference normalizing circuit NRM of the PLL circuit having the fraction multiplying function illustrated in FIG. 13 may operate as illustrated in FIG. 18. The logic circuit LOGIC2 may perform the operation P11 illustrated in FIG. 11 and adjust the initial value of the normalizing coefficient norm so that the phase difference REVnorm is larger than 1 and smaller than 2. The logic circuit LOGIC2 divides the frequency command word FCW supplied from the outside of the PLL circuit into an integer portion int and the fractional portion frac in an operation P202.

The logic circuit LOGIC2 measures the difference ΔREVnorm between two consecutive phase differences REVnorm in an operation P204. Operations P204 through P222 may be performed after the PLL circuit is locked. When the fractional portion frac is larger than 0.5 in the operation P206, the process proceeds to an operation P208. When the fractional portion frac is smaller than 0.5, the process proceeds to an operation P218.

When the difference ΔREVnorm is smaller than "0", e.g., negative in the operation P208, the process proceeds to an operation P210. When the difference ΔREVnorm is larger than "0" in the operation P208, the process proceeds to the operation P204 as the logic circuit LOGIC2 do not identify whether the normalizing coefficient norm substantially equals the expected value tLSB/tOSC or not.

When the absolute value of the difference ΔREVnorm is larger than the fractional portion frac in the operation P210, e.g., ΔREVnorm in the lower characteristic illustrated in FIG. 17 is −0.9, the process proceeds to the operation P214. When the absolute value of the difference ΔREVnorm is equal to or smaller than the fractional portion frac in the operation P210, e.g., ΔREVnorm in the lower characteristic illustrated in FIG. 16 is −0.6, the process proceeds to the operation P212.

When the absolute value of the difference ΔREVnorm is substantially equal to the fractional portion frac in the operation P212, the logic circuit LOGIC2 identifies that the normalizing coefficient norm has been pulled into the expected value tLSB/tOSC, and the process returns to the operation P204. When the absolute value of the difference ΔREVnorm is unequal to the fractional portion frac, the logic circuit LOGIC2 identifies that the normalizing coefficient norm has not been pulled into the expected value tLSB/tOSC yet, and the process proceeds to the operation P216.

The logic circuit LOGIC2 may reduce the normalizing coefficient norm by the value Δ in the operation P214. The logic circuit LOGIC2 may increase the normalizing coefficient norm by the value Δ in the operation P216. The value Δ may be smaller enough than the normalizing coefficient norm. The process proceeds to the operation P208 after the operations P214 and P216.

When the difference ΔREVnorm is larger than 0 in the operation P218, e.g., the difference ΔREVnorm is positive, the process proceeds to the operation P220. When the difference ΔREVnorm is equal to or smaller than 0 in the operation P218, the logic circuit LOGIC2 does not identify whether the normalizing coefficient norm equals the expected value tLSB/tOSC or not, and the process proceeds to the operation P204.

When the difference ΔREVnorm is larger than "1-frac" in the operation P220, e.g., ΔREVnorm is 0.9 as indicated by the upper characteristic illustrated in FIG. 17, the process proceeds to an operation P224. When the difference ΔREVnorm is equal to or smaller than "1-frac" in the process P220, e.g., ΔREVnorm is 0.6 as indicated by the upper characteristic illustrated in FIG. 16, the process proceeds to an operation P222.

When the difference ΔREVnorm is substantially equal to 1-frac in the operation P222, the logic circuit LOGIC2 identifies that the normalizing coefficient norm has been pulled into the expected value tLSB/tOSC, and the process returns to the operation P204. When the difference ΔREVnorm is unequal to 1-frac, the logic circuit LOGIC2 identifies that the normalizing coefficient norm has not been pulled into the expected value tLSB/tOSC yet, and the process proceeds to the operation P226.

The logic circuit LOGIC2 may reduce the normalizing coefficient norm by the value Δ in the operation P224. The logic circuit LOGIC2 may increase the normalizing coefficient norm by the value Δ in the operation P226.

The normalizing coefficient norm is adjusted in accordance with the difference ΔREVnorm between two consecutive phase differences REVnorm, and is pulled into a specific value, e.g., the expected value tLSB/tOSC. When the normalizing coefficient norm is pulled into a specific value, the phase difference REVnorm may decrease by frac if frac>0.5 when REVnorm turns back as illustrated in FIGS. 14 and 15. The phase difference REVnorm may increase by 1-frac if frac<0.5 when the phase difference REVnorm turns back.

The logic circuit LOGIC2 may perform the operation illustrated in FIG. 18. A large dividing circuit or a large averaging circuit may not be used. For example, the simplified logic circuit LOGIC2 may perform the operation illustrated in FIG. 18. In the operations P210 or P220, frac or 1-frac to be compared with the difference ΔREVnorm may be larger than 0.5. When the fractional portion frac is larger than 0.5 or smaller than 0.5, inequality relations with respect to the difference ΔREVnorm may be easily detected.

Figure 19:
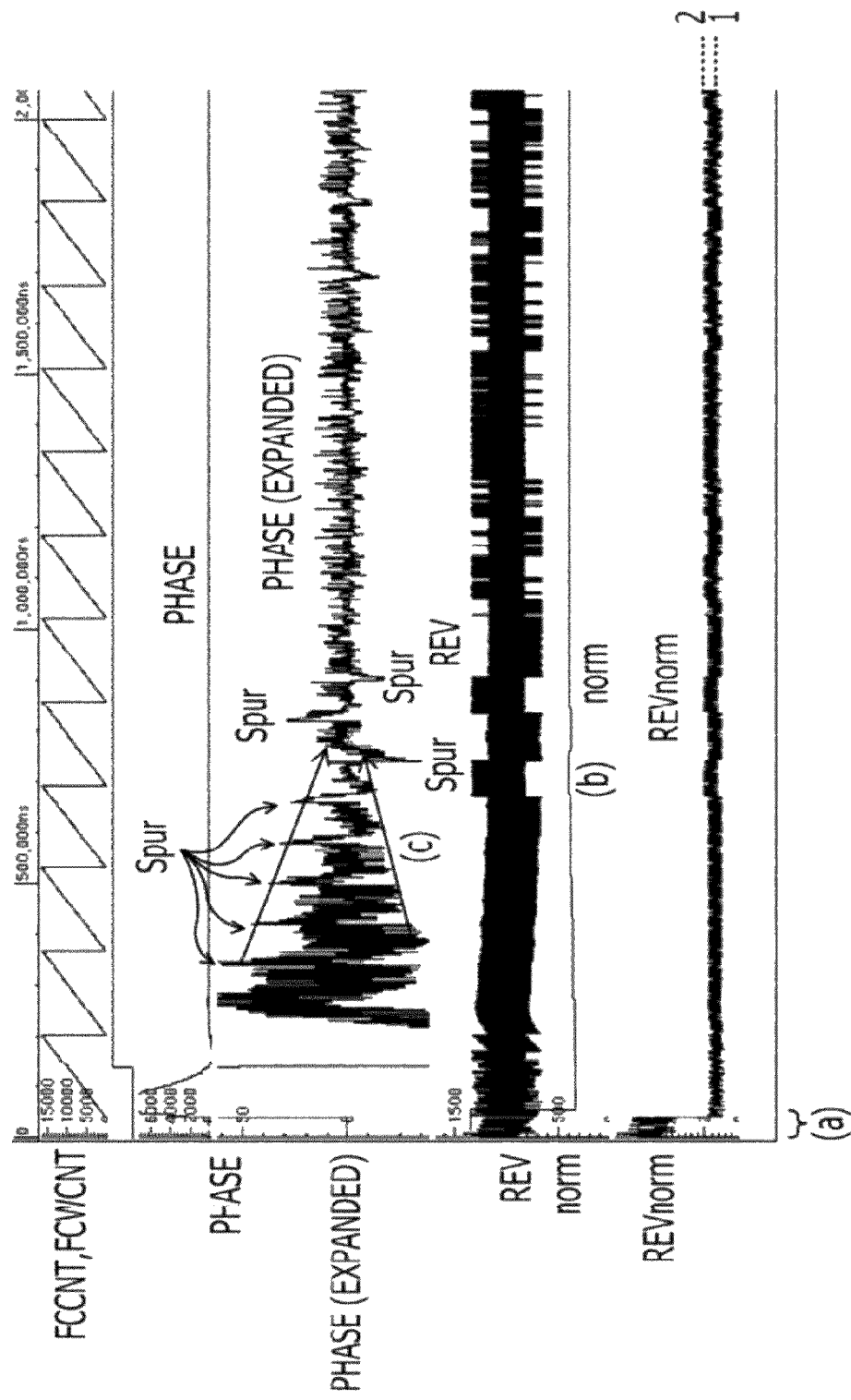
FIG. 19 illustrates an exemplary simulated waveform.

FIG. 19 illustrates an exemplary simulated waveform. The simulated waveform illustrated in FIG. 19 may be a simulated waveform in the PLL circuit having the fraction multiplying function illustrated in FIG. 13. When the PLL circuit starts operation as indicated by (a) in FIG. 19, the operation P11 illustrated in FIG. 11 is performed and the phase difference REVnorm is initially set to a value larger than 1 and smaller than 2. As indicated by (b) in FIG. 19, the operation P216 or P226 illustrated in FIG. 18 is repeated and the normalizing coefficient norm increases. As indicated by (c) in FIG. 19, the normalizing coefficient norm becomes close to the expected value, and an amplitude of the phase difference signal PHASE decreases. The difference ΔREVnorm which periodically appears as illustrated in FIGS. 16 and 17 decreases as the amplitude of the phase difference signal PHASE decreases, and may become close to the value of the fractional portion frac or 1-frac. Periodic noise Spur which occurs to the phase difference signal PHASE may decrease. A change in the phase difference REVnorm may be substantially the same as or similar to the characteristic illustrated in FIG. 14 based on the characteristic illustrated in FIG. 16 or FIG. 17, for example. The normalizing coefficient norm may be pulled into the expected value tLSB/tOSC to be a substantially certain value.

The PLL circuit illustrated in FIG. 13 may have an effect substantially the same as or similar to the effect that the PLL circuit illustrated in FIG. 1. The simplified logic circuit LOGIC2 of the PLL circuit having the fraction multiplying function may precisely normalize the counted value REV and pull the normalizing coefficient norm into a correct value. The phase difference Δt between the reference clock signal REF and the output clock signal CLKOUT decreases, and the PLL circuit may be precisely locked.

Figure 20:
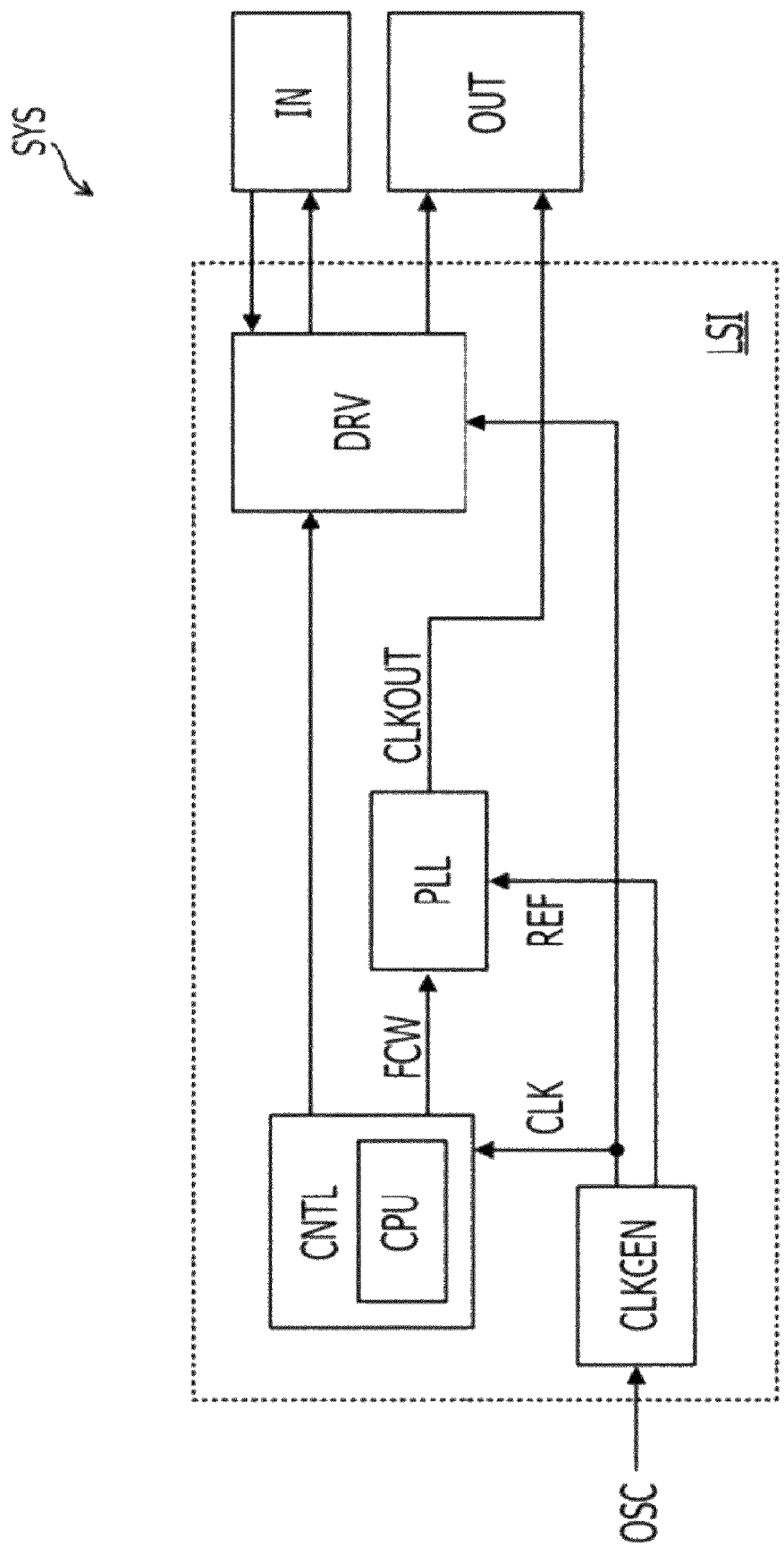
FIG. 20 illustrates an exemplary system.

FIG. 20 illustrates an exemplary system. The system SYS illustrated in FIG. 20 may include the PLL circuit described above. The system SYS may be a microcomputer-applied device such as a mobile device, etc. The system SYS may include a semiconductor integrated circuit LSI coupled to a board, a plurality of semiconductor chips, an input device IN or an output device OUT, etc.

The semiconductor integrated circuit LSI may include a clock generating circuit CLKGEN, a control circuit CNTL, the PLL circuit described above or a driver circuit DRV. The clock generating circuit CLKGEN receives an oscillated signal OSC from a crystal oscillator, etc., and generates a fundamental clock signal CLK for operating the system SYS and the reference clock signal REF to be supplied to the PLL circuit. The control circuit CNTL may include a CPU which executes a program for operating the system SYS. The control circuit CNTL controls a circuit in the semiconductor integrated circuit LSI such as the driver circuit DRV, etc., and changes the frequency command word FCW in accordance with an operation state of the system SYS.

The driver circuit DRV operates in synchronization with the fundamental clock signal CLK so as to control the output device OUT or the input device IN, etc. The output device OUT may include a liquid crystal display, etc. The input device IN may include a power switch and a touch panel provided on the surface of the liquid crystal display, etc. For example, the output device OUT receives the output clock signal CLKOUT as a horizontal synchronization signal so as to display an image or text. The CPU may change the frequency command word FCW in accordance with the operation state of the system SYS and an operation mode of the output device OUT, thereby a frequency of a periodic signal being changed.

All examples and conditional language recited herein are intended for pedagogical objects to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A PLL circuit comprising:
a first counter to accumulate a frequency command word in response to a reference clock signal and to generate a first counted value;
a second counter to count a clock pulse of an output clock signal and generate a second counted value;
a time measuring circuit to measure an interval between a transition edge of the reference clock signal and a transition edge of the output clock signal to output the interval as a third counted value;
a phase difference normalizing circuit to multiply the third counted value by a normalizing coefficient to normalize the third counted value into a first phase difference corresponding to the number of clock pulses of the output clock signal;
an operating circuit to obtain a subtraction value by subtracting the first phase difference from the second counted value and to subtract the subtraction value from the first counted value to generate a phase difference signal indicating a second phase difference between the reference clock signal and the output clock signal; and
an oscillator circuit to change a frequency of the output clock signal based on the phase difference signal,
wherein the phase difference normalizing circuit changes the normalizing coefficient until the second phase difference at a first value and the second phase difference at a second value appear at random when the second phase difference at the first value or the second phase difference at the second value consecutively appears after the PLL is locked.

2. The PLL circuit according to claim 1, further comprising:
a loop filter to receive the phase difference signal.

3. The PLL circuit according to claim 1, wherein the interval is a period of time from when the transition edge of the reference clock signal appears to when the transition edge indicating a clock cycle of the output clock signal appears twice.

4. The PLL circuit according to claim 1, wherein the phase of the reference clock signal is synchronized with the phase of the output clock signal by changing the frequency of the output clock signal.

5. The PLL circuit according to claim 1, wherein the phase difference normalizing circuit changes the normalizing coefficient in a first direction when the second phase difference at the first value consecutively appears and the phase difference normalizing circuit changes the normalizing coefficient in a second direction when the phase difference at the second value consecutively appears.

6. A PLL circuit comprising:
a first counter to accumulate a frequency command word in response to a reference clock signal and generate a first counted value;
a second counter to count a clock pulse of an output clock signal and generate a second counted value;
a time measuring circuit to measure an interval between a transition edge of the reference clock signal and a transition edge of the output clock signal to output the interval as a third counted value;
a phase difference normalizing circuit to multiply the third counted value by a normalizing coefficient to normalize the third counted value into a first phase difference corresponding to the number of clock pulses of the output clock signal;
an operating circuit to obtain a subtraction value by subtracting the first phase difference from the second counted value and to subtract the subtraction value from the first counted value to generate a phase difference signal indicating a second phase difference between the reference clock signal and the output clock signal; and
an oscillator circuit to change a frequency of the output clock signal based on the phase difference signal,
wherein
the phase difference normalizing circuit changes the normalizing coefficient based on a value of a fractional portion of a multiplication rate of the frequency command word and a differential value between two of the second phase differences after the PLL circuit is locked.

7. The PLL circuit according to claim 6, further comprising:
a loop filter to receive the phase difference signal.

8. The PLL circuit according to claim 6, wherein the interval is a period of time from when the transition edge of the reference clock signal appears to when the transition edge indicating a clock cycle of the output clock signal appears twice.

9. The PLL circuit according to claim 6, wherein the phase of the reference clock signal is synchronized with the phase of the output clock signal by changing the frequency of the output clock signal.

10. The PLL circuit according to claim 6, wherein the phase difference normalizing circuit reduces the normalizing coefficient when an absolute value of the differential value is larger than the value of the fractional portion and the phase difference normalizing circuit increases the normalizing coefficient when the absolute value of the differential value is equal to or smaller than the value of the fractional portion, in a case where the value of the fractional portion is larger than a first value and the differential value is negative, and
the phase difference normalizing circuit reduces the normalizing coefficient when the differential value is larger than a value obtained by subtracting the value of the fractional portion from a second value and the phase difference normalizing circuit increases the normalizing coefficient when the differential value is smaller than the obtained value in a case where the value of the fractional portion is equal to or smaller than the first value and the differential value is positive.

11. The PLL circuit according to claim 6, wherein the phase difference normalizing circuit repeats a first operation of reducing the normalizing coefficient when the phase difference is larger than a third value and a second operation of increasing the normalizing coefficient when the phase difference is smaller than a first value until the phase difference becomes larger than the first value and smaller than a second value.

12. The PLL circuit according to claim 11, wherein the second phase difference is reduced in the first operation and the second phase difference increases in the second operation.

13. The PLL circuit according to claim 6 further comprising:
a first flip-flop circuit to latch the reference clock signal in synchronization with the output clock signal; and
a second flip-flop circuit to latch an output signal of the first flip-flop circuit in synchronization with the output clock signal,
wherein the time measuring circuit measures an interval between the transition edge of the reference clock signal and a transition edge of an output signal of the second flip-flop circuit.

14. A method for operating a PLL circuit, comprising:
accumulating a value of a frequency command word in response to a reference clock signal to generate a first counted value;
counting a clock pulse of an output clock signal to generate a second counted value;
measuring an interval between a transition edge of the reference clock signal and a transition edge of the output clock signal to output the interval as a third counted value;
multiplying the third counted value by a normalizing coefficient to normalize the third counted value into a first phase difference corresponding to a number of clock pulses of the output clock signal;
obtaining a subtraction value by subtracting the first phase difference from the second counted value;
subtracting the subtraction value from the first counted value to generate a phase difference signal indicating a second phase difference between the reference clock signal and the output clock signal;
changing a frequency of the output clock signal based on the phase difference signal; and
changing the normalizing coefficient until the second phase difference at a first value and the second phase difference at a second value appear at random when the second phase difference at the first value or the second phase difference at the second value consecutively appears after the PLL circuit is locked.

15. The method for operating a PLL circuit according to claim 14, further comprising:
changing the frequency of the output clock signal so that the phase of the reference clock signal is synchronized with the phase of the output clock signal.

16. The method for operating a PLL circuit according to claim 14, wherein the interval is a period of time from when the transition edge of the reference clock signal appears to when the transition edge indicating a clock cycle of the output clock signal appears twice.

17. The method for operating a PLL circuit according to claim 14, further comprising:
changing the normalizing coefficient in a first direction when the second phase difference at the first value consecutively appears; and
changing the normalizing coefficient in a second direction when the phase difference at the second value consecutively appears.

* * * * *